(12) United States Patent
Tsukikawa

(10) Patent No.: US 6,727,738 B2
(45) Date of Patent: Apr. 27, 2004

(54) CONFIGURATION FOR GENERATING A CLOCK INCLUDING A DELAY CIRCUIT AND METHOD THEREOF

(75) Inventor: Yasuhiko Tsukikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/877,027

(22) Filed: Jun. 11, 2001

(65) Prior Publication Data

US 2002/0075047 A1 Jun. 20, 2002

(30) Foreign Application Priority Data

Dec. 19, 2000  (JP) ........................... 2000-385020

(51) Int. Cl.⁷ .............................................. H03L 7/00
(52) U.S. Cl. ......................... 327/160; 375/374
(58) Field of Search ........................... 327/156, 160, 327/153, 158, 161, 265, 273, 276, 277, 149, 271; 375/374, 375, 376; 377/49, 107, 34; 365/194, 233, 236

(56) References Cited

U.S. PATENT DOCUMENTS

| | | | |
|---|---|---|---|
| 5,552,750 A | * 9/1996 | Barrett et al. | 327/105 |
| 5,796,673 A | 8/1998 | Foss et al. | 365/233 |
| 5,805,003 A | * 9/1998 | Hsu | 327/149 |
| 6,100,733 A | 8/2000 | Dortu et al. | 327/149 |
| 6,125,157 A | * 9/2000 | Donnelly et al. | 327/141 |
| 6,154,073 A | * 11/2000 | Choi | 327/157 |
| 6,215,726 B1 | * 4/2001 | Kubo | 327/141 |
| 6,225,843 B1 | * 5/2001 | Taniguchi et al. | 327/149 |
| 6,247,138 B1 | 6/2001 | Tamura et al. | 713/600 |
| 6,281,726 B1 | * 8/2001 | Miller, Jr. | 327/156 |
| 6,324,118 B1 | * 11/2001 | Ooishi | 365/230.03 |

FOREIGN PATENT DOCUMENTS

| | | | |
|---|---|---|---|
| DE | 691 13 836 | 3/1990 | |
| DE | 693 28 084 | 12/1992 | |
| EP | 0 704 975 | 4/1996 | |
| TW | 090119749 | 4/2000 | ............. H03L/7/06 |
| WO | WO 98/37656 | 8/1998 | |

OTHER PUBLICATIONS

Tetsuya Iizuka, Baifukan, "Design of CMOS Ultra LSI", Apr. 25, 1989, p. 128.

* cited by examiner

Primary Examiner—Linh M. Nguyen
(74) Attorney, Agent, or Firm—McDermott, Will & Emery

(57) ABSTRACT

A delay locked loop (DLL) employs a gray code (an alternate code) counter as a delay register. Preventing a carry from arising at more than one bit can minimize skipping of delay time (discontinuous skipping thereof) if a metastable state should occur.

14 Claims, 24 Drawing Sheets

FIG.1

DESCRIPTION OF 4-BIT GRAY CODE

| DECIMAL CODE | BINARY CODE ADR<3~0> | | | | GRAY CODE GADR<3~0> | | | |
|---|---|---|---|---|---|---|---|---|
| | <3> | <2> | <1> | <0> | <3> | <2> | <1> | <0> |
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 0 | 0 | 0 | 1 | 1 |
| 3 | 0 | 0 | 1 | 1 | 0 | 0 | 1 | 0 |
| 4 | 0 | 1 | 0 | 0 | 0 | 1 | 1 | 0 |
| 5 | 0 | 1 | 0 | 1 | 0 | 1 | 1 | 1 |
| 6 | 0 | 1 | 1 | 0 | 0 | 1 | 0 | 1 |
| 7 | 0 | 1 | 1 | 1 | 0 | 1 | 0 | 0 |
| 8 | 1 | 0 | 0 | 0 | 1 | 1 | 0 | 0 |
| 9 | 1 | 0 | 0 | 1 | 1 | 1 | 0 | 1 |
| 10 | 1 | 0 | 1 | 0 | 1 | 1 | 1 | 1 |
| 11 | 1 | 0 | 1 | 1 | 1 | 1 | 1 | 0 |
| 12 | 1 | 1 | 0 | 0 | 1 | 0 | 1 | 0 |
| 13 | 1 | 1 | 0 | 1 | 1 | 0 | 1 | 1 |
| 14 | 1 | 1 | 1 | 0 | 1 | 0 | 0 | 1 |
| 15 | 1 | 1 | 1 | 1 | 1 | 0 | 0 | 0 |

• CARRY

↑ DOWNWARD DIRECTION ↓

↑ UPWARD DIRECTION ↓

FIG.2

EXPRESSION CONVERTING 4-BIT GRAY CODE INTO 4-BIT BINARY CODE

| BINARY CODE ADR<3~0> | | GRAY CODE GADR<3~0> |
|---|---|---|
| ADR<3> | = | GADR<3> |
| ADR<2> | = | Exor(GADR<3>,GADR<2>) |
| ADR<1> | = | Exor(GADR<3>~GADR<1>) |
| ADR<0> | = | Exor(GADR<3>~GADR<0>) |

FIG.3

EXPRESSION CONVERTING N-BIT GRAY CODE INTO N-BIT BINARY CODE

| BINARY CODE ADR<n-1~0> | | GRAY CODE GADR<n-1~0> |
|---|---|---|
| ADR<n-1> | = | GADR<n-1> |
| ADR<n-2> | = | Exor(GADR<n-1>,GADR<n-2>) |
| ADR<n-3> | = | Exor(GADR<n-1>~GADR<n-3>) |
| ⋮ | ⋮ | ⋮ |
| ADR<0> | = | Exor(GADR<n-1>~GADR<0>) |

FIG.4

EXEMPLARY LOCATION OF CARRY OF 4-BIT GRAY CODE

| DECIMAL CODE | BINARY CODE | GRAY CODE |
|---|---|---|
| 5 | 0 1 0 1 | 0 1 1 1 |
| 6 | 0 1 ① ⓪ | 0 1 0 1 |
| 7 | 0 1 1 1 | 0 1 0 0 |

↑ DOWNWARD
↓ UPWARD

UP (UPF="H",DNF="L")

DOWN (DNF="H",UPF="L")

FIG.29 PRIOR ART
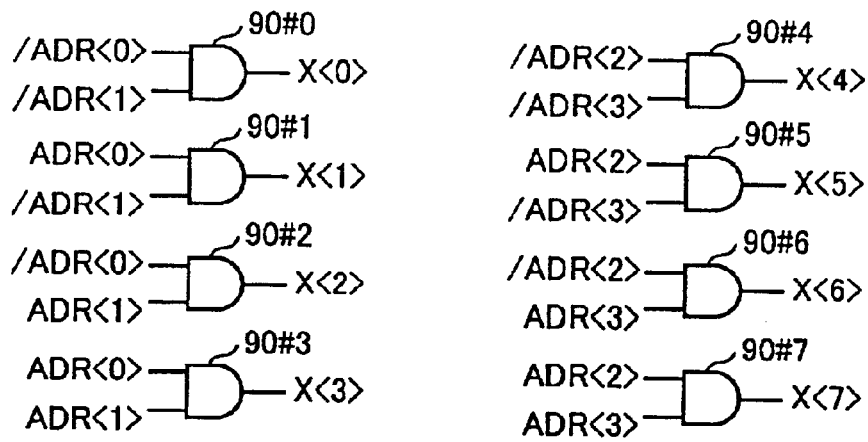
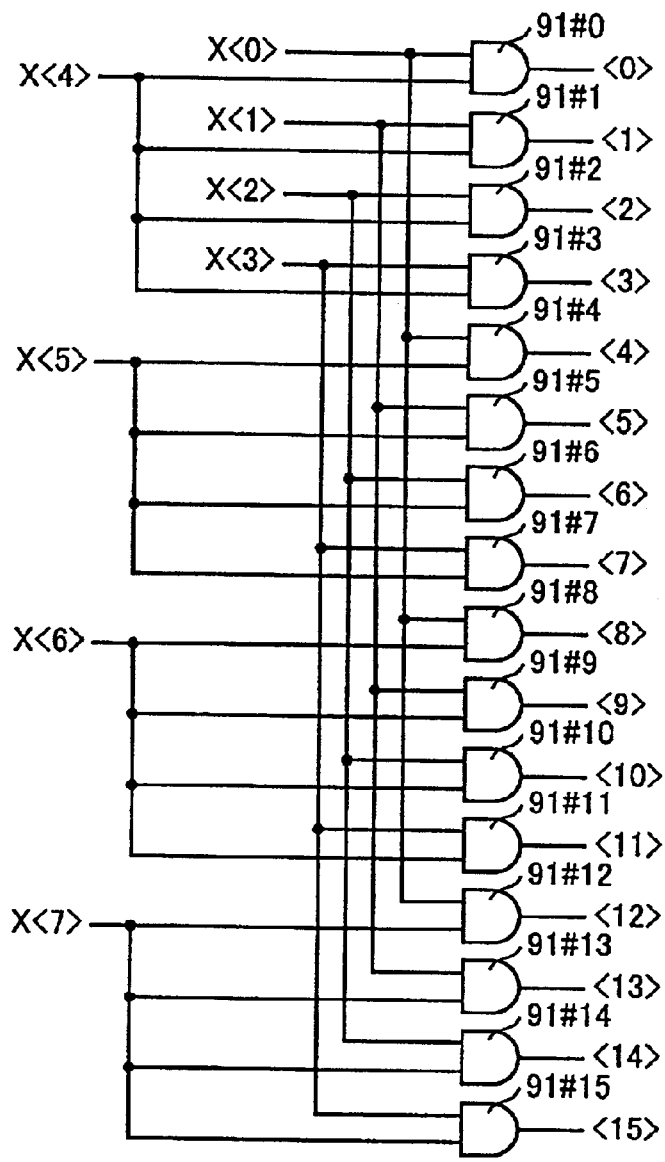

CONFIGURATION FOR GENERATING A CLOCK INCLUDING A DELAY CIRCUIT AND METHOD THEREOF

BACKGROUND OF THE INVENTION

1. Field of the Invention

The present invention relates to delay locked loops used to provide accurate synchronization in a system operating in synchronization with a clock, semiconductor devices including the delay locked loops, and control methods for systems operating in synchronization with a clock.

2. Description of the Background Art

A case is considered in which in a system operating in synchronization with a clock a component receives a read instruction in synchronization with a clock that instructs reading data and in response to the instruction the read data is returned to a system bus in synchronization with a clock. Note that hereinafter a reference character ADR denotes a binary code, a reference character ADR<k> means a k-th bit in a binary code, referred to as a register value ADR<k> or a binary code ADR<k>.

It is also assumed that with a system clock period represented by "T" the component requires a time period T0 to prepare read data after it has received the read instruction, and that clock period T may be greater in length than period T0 or vice versa and for an integer N there is established a relationship N×T<T0<(N+1)×T. In this scenario, the following manner is considered to provide an output.

With reference to FIG. 17, at time t1 (a rising edge 0 of a clock CLKext) a read instruction to read data is issued in synchronization with clock CLKext, and read data is prepared, and in synchronization with a subsequent rising edge 1 of clock CLKext (at time t2: t2=t1+T) the data is output.

The component requires a time period Td after it has received clock CLKext and before it outputs prepared data to an output buffer. As such, the data is actually output when time period Td elapses following the clock edge 1.

Time period Td includes, as shown in FIG. 18, a time period Tin and a time period Tout (Td=Tin+Tout). Time period Tin is required for the component to internally generate from clock CLKext a clock CLKin driving the output buffer. Time period Tout is required for driving a system bus corresponding to an output load after clock CLKin has driven and thus started the output buffer to operate until the system bus exceeds a predetermined logical threshold value.

As such, in this system it is not until Td elapses following clock edge 1 that data is actually output to a system bus. Accordingly, the system is designed to take data in at subsequent clock edge 2.

If in such an operation, system clock period T is equal to or smaller than Td and thus has a high frequency, then a problem occurs, as shown in FIG. 19. In FIG. 19, at clock edge 1 a data output operation is started, and at clock edge 2 data is not yet transmitted on a bus, since delay time Td is greater than T. As such, it is not until a subsequent clock edge 3 arrives that the system can take data in. In other words, if the system is designed to take data in at clock edge 2 the system would operate erroneously.

In particular, a recently developed memory, DDR-SDRAM (double data rate, synchronous dynamic random access memory) outputs data at both of rising edge and trailing edge of a clock. As such, if the aforementioned method of outputting data is applied to the DDR-SDRAM, as shown in FIG. 20, the same problem as described above would come to the surface at a time point when half the clock period is substantially equal to Td.

Such a disadvantage as above is conventionally overcome by a delay locked loop (hereinafter referred to as a DLL). With reference to FIG. 21, a component employing a DLL receives a system clock CLKext and internally delays the clock via a delay element by Tdll1. Then it generates an internal clock CLKin2 rising before a rising edge of the system clock by a time period corresponding to an output buffer drive time (Tout'=Tout).

Using internal clock CLKin2 to drive the output buffer allows read data to have been output on a bus at an edge of system clock CLKext. That is, a relation Tdll1+Tout'=m×T, wherein m is an integer equal to or larger than one, can be established.

Thus a DLL can be used to time an output in synchronization with a clock. The DLL can also be similarly used for an input buffer allowing a component to take in various control signals and input data through a system bus.

The operating timing of an input buffer which does not use a DLL will be described with reference to FIG. 22. As shown in FIG. 22, this input buffer without DLL requires a time period Tin after clock CLKext is received and before a component internally generates internal clock CLKin.

As such, an externally received control signal SIG is internally delayed by a time period Tin" corresponding to Tin, to be a signal SIGin. At the edge timing of internal clock CLKin, signal SIGin is latched by a latch circuit 910 and ascertained. In the figure an ascertained control signal is shown.

With reference to FIG. 23, latch circuit 910 includes inverters IV1–IV4 and NAND circuits N1–N4. Inverters IV1 and IV3 operate in response to internal clock CLKin and a clock/CLKin, an inverted version of internal clock CLKin.

As such, if a DLL is not used, it is not until a delay of at least Tin elapses following an edge of system clock CLKext that a component can use a control signal. As such, the component itself would not be suitable for high speed operation.

Such delay is compensated for by the aforementioned DLL. Reference will now be made to FIG. 24 to describe an operating waveform when the DLL is used. With reference to FIG. 24, system clock CLKext is delayed in a component via a delay element by Tdll2 to generate an internal clock CLKin3 having an edge at the same position at that of a system clock CLKext. If internal clock CLKin3 is used to latch control signal SIG then control signal SIG can be latched faster than the above case by a time period corresponding to Tin. Thus the system can be designed to be suitable for high speed operation. Herein, from the above description there can be established a relationship Tdll12=m×T.

Reference will now be made to FIG. 25 to describe by way of example a configuration of a circuit configuring a DLL conventionally used. A conventional DLL 9000, as shown in FIG. 25, includes a clock buffer 1, a fine delay element 3, a coarse delay element 5, a decoder 70, a binary counter 80 corresponding to a delay register, a phase comparator 9, a timing clock generator 10, a pulse generator 11 and a replica circuit 13.

External clock CLKext is input to clock buffer 1. Clock buffer 1 outputs a clock BUFFCLK. Between external clock CLKext and clock BUFFCLK time Tin elapses.

Clock BUFFCLK is input to fine delay element 3. Fine delay element 3 delays clock BUFFCLK by Tfine to output a clock CLKA. Delay time Tfine, elapsing between clock BUFFCLK and clock CLKA, is variable, varying in a small unit Tf (a unit of approximately 40 psec) depending on the value of a 3-bit register value ADR<0:2> input to fine delay element 3.

Clock CLKA is input to coarse delay element 5. Coarse delay element 5 delays clock CLKA by Tcoarse to output a clock CLKB. Delay time Tcoarse, elapsing between clocks CLKA and CLKB, is variable, varying in a coarse unit Tc depending on a 6-bit register value ADR<3:8>. It should be noted that Tc is set to be 8 times Tf in length.

Fine delay element 3 and coarse delay element 5 each provide an amount of delay determined by a register value output from binary counter 80.

In the circuit configuration, at least a delay time Tx is required for a clock to pass through fine delay element 3 and coarse delay element 5. With the clock passing through fine delay element 3 and coarse delay element 5, a delay of Tx would be inevitably result even if a register value is the value of a minimal delay time.

The conventional DLL has fine delay element 3 and coarse delay element 5 each having a delay time set by a binary code. For example, fine delay element 3 has delay periods of time Tf, 2×Tf and 3×Tf for register values ADR<0:2> of "001", "010", and "011", respectively, and coarse delay element 5 has delay periods of time 7×Tc and 8×Tc for register values ADR<3:8> of "000111" and "001000", respectively.

As such, if delay time Tx resulting from the aforementioned circuit configuration is also considered, then for a register value of "001001" determining Tcoarse and that of "011" determining Tfine a total of delay time Tfine+Tcoarse=Tx+3×Tf+9×Tc elapses between docks BUFFCLK and CLKB.

Hereinafter, if coarse delay element 5 receives a register value "001001" and fine delay element 3 receives a register value "011" they will be generally represented as a register value "001001011".

Clock CLKB is input to pulse generator 11 generating internal clock CLKin2 used to drive an output buffer and internal clock CLKin3 used to drive an input buffer, and to replica circuit 13. Internal clock CLKin2 serves as has been described with reference to FIG. 21. Thus at the rising edge of external clock CLKext an output of the output buffer is transmitted onto a system bus.

Replica circuit 13 delays clock CLKB by a fixed delay period of time (Tin'+Tout') imitating a sum of input buffer delay time Tin and output buffer drive time Tout, to generate a clock FBCLK (FIG. 26).

Thus between clocks BUFFCLK and FBCLK there elapses a delay period of time Tfine+Tcoarse+Tin'+Tout'. Between the issuance of external clock CLKext and the generation of clock FBCLK various signals have a relationship therebetween, as shown in FIG. 26.

Reference will now be made to FIG. 27 to describe a waveform when a DLL operates to satisfy a desired delay time. In the FIG. 27 example, clocks BUFFCLK and FBCLK rise simultaneously. External clock CLKext is ahead of clock BUFFCLK by Tin and internal clock CLKin2 has a rising edge ahead of clock FBCLK by Tin'+Tout'). Thus, internal clock CLKin2 has a rising edge ahead of that of external clock CLKext by Tout'. This corresponds to the timing as has been described with reference to FIG. 21.

Herein replica circuit 13 provides a delay time designed so that Tin=Tin' and Tout=Tout'.

Herein to determine the DLL's optimal delay time a circuit is required to detect which one of clocks BUFFCLK and FBCLK rises ahead of the other. This circuit is phase comparator 9 shown in FIG. 25. Phase comparator 9 detects a phase difference between clocks BUFFCLK and FBCLK and outputs signals UPF and DNF.

Reference will now be made to FIGS. 28A and 28B to describe signals UPF and DNF. If clock FBCLK phase is ahead of clock BUFFCLK phase, phase comparator 9 provides an output "up" (UPF is high and DNF is low), as shown in FIG. 28A. If clock FBCLK phase is behind clock BUFFCLK phase, phase comparator 9 provides an output "down" (DNF is high and UPF is low), as shown in FIG. 28B.

An exemplary configuration of phase comparator 9 is shown in FIG. 30. Phase comparator 9, as shown in FIG. 30, includes NAND circuits N5–N10. Clocks BUFFCLK and FBCLK input to NAND circuits N5 and N6, respectively, contribute to signals UPF and DNF, respectively, output from NAND circuits N9 and N10, respectively.

With reference to FIG. 25, timing clock generator 10 receives signals UPF and DNF and generates a counter updating clock CLKCNT and up and down signals UP and DN.

In response to counter updating clock CLKCNT binary counter 80 outputs register values ADR<0:2> and ADR<3:8> depending on up and down signals UP and DN.

If phase comparator 9 provides output "UP" then the current register value increases. For example "000000010" increases to "000000011". If phase comparator 9 provides output "DOWN" then the current register value decreases. For example "000000011" decreases to "000000010".

Decoder 70 decodes register value ADR<3:8>. Decoder 70, as shown in FIG. 29, includes AND circuits 90#0–90#7 and 91#0–91#15.

AND circuit 90#0 receives binary code /ADR<0>, an inverted version of binary code ADR<0>, and binary code /ADR<1>, an inverted version of binary code ADR<1>, and AND circuit 90#1 receives binary codes ADR<0>and /ADR<1>.

AND circuit 90#2 receives binary codes /ADR<0> and ADR<1> and AND circuit 90#3 receives binary codes ADR<0> and ADR<1>.

AND circuit 90#4 receives binary code /ADR<2>, an inverted version of binary code ADR<2>, and binary code /ADR<3>, an inverted version of binary code ADR<3>, and AND circuit 90#5 receives binary codes ADR<2>and /ADR<3>.

AND circuit 90#6 receives binary codes /ADR<2> and ADR<3> and AND circuit 90#7 receives binary codes ADR<2> and ADR<3>.

AND circuit 91#i has inputs receiving an output X<i> from AND circuit 90#i and an output X<4> from AND circuit 90#4, wherein i=0 to 3. AND circuit 91#i+4 receives an output X<i> from AND circuit 90#i and an output X<5> from AND circuit 90#5, wherein i=0 to 3. AND circuit 91i+8 has inputs receiving an output X<i> from AND circuit 90#i and an output X<6> from AND circuit 90#6, wherein i=0 to 3. AND circuit 91#i+12 receives an output X<i> from AND circuit 90#i and an output X<7> from AND circuit 90#7, wherein i=0 to 3. Depending on the output from AND circuit 90#k the number of delay stages of coarse delay element 5 (k, for example) is determined, wherein k=0 to 15. While herein a 4-bit binary decoder is exemplified, those skilled in the art would readily understand that a 6-bit binary decoder receiving ADR<3>–ADR<8> can also be implemented by employing a similar circuit.

If the external clock is delayed too significantly then output "DOWN" renders a delay time shorter and if a delay is insufficient then output "UP" renders a delay time longer. As a result, DLL 9000 is stabilized with a delay time as described.

Thus while detecting which one of clocks BUFFCLK and FBCLK phases is ahead of the other, the DLL appropriately adjusts the delay time of delay element 3 and that of delay element 5 to maintain clocks BUFFCLK and FBCLK rising simultaneously.

If there is a distinct phase difference, as shown in FIGS. 28A and 28B, then there would not be any problems. However, as has been described above, DLL 9000 must monitor the phase difference between clocks BUFFCLK and FBCLK and operate to adjust delay elements 3 and 5 to maintain the clocks free of any substantial phase difference.

As such, in the normal state with DLL 9000 operating, inherently there is no substantial phase difference between clocks BUFFCLK and FBCLK. In this case, the situation occurs with a certain probability in which phase comparator 9 requires a significantly long period of time to determine whether to provide output "UP" or "DOWN".

This generally applies to flip-flops including phase comparator 9 and it is a phenomenon known as the metastable state.

However, as described in Design of CMOS Ultra LSI, BAIFUKAN, 1989, p.128, it is practically impossible to completely eliminate the possibility of occurrence of the metastable state. In such a case, using binary counter 80 as conventional may result in erroneous operation.

For example, if the current register value is "011111111" then the subsequent register value would be "100000000" for output "UP" and "011111110" for output "DOWN".

More specifically in this example the MSB bit through a bit immediately preceding the LSB bit for a total of eight bits vary depending on whether phase comparator 9 outputs "UP" or "DOWN". In other words, for "UP" nine bits have carry "1", whereas for "DOWN" the bits other than the LSB bit have carry "0". Thus a carry has a value significantly varying depending on whether phase comparator 9 outputs "UP" or "DOWN".

In such an instant if the metastable state occurs it is not certain whether phase comparator 9 is "UP" or "DOWN", i.e., whether a register's carry is "0" or "1". As a result, a subsequent register state is not ascertained. In effect, it has a random value.

In other words, the DLL would have a delay time suddenly varying from a value to a significantly different value. For example, if a register value "011111111" changes to "010101010" then the delay elements would have a delay time Tcoarse+Tfine changing from 31×Tc+7×Tf to 21×Tc+2×Tf.

Thus, in the DLL, expected to be stable in a desired delay state, a delay time suddenly and significantly diverges, resulting in the entire system operating erroneously.

SUMMARY OF THE INVENTION

An object of the present invention is to provide a configuration capable of minimizing skipping of delay when a clock is generated, and a method thereof.

According to one aspect of the present invention, a delay locked loop includes a delay circuit delaying a first clock to output a second clock, a detector detecting a phase difference between the first and second clocks, and a gray code counter using a gray cord, responsive to an output of the detector for generating a signal adjusting an amount of delay of the delay circuit.

Preferably the gray code counter includes a gray code register storing the gray code, a binary code converter converting the gray code into a binary code, an upward carry/downward carry generator using the binary code stored in the binary code converter, to generate an upward carry signal and a downward carry signal, and a carry multiplexer generating from the upward carry signal and the downward carry signal a carry signal corresponding to a result obtained by the detector, for updating the gray code in the gray code register.

In particular the delay circuit includes a fine delay element and a coarse delay element having an amount of delay greater per unit than the fine delay element, the fine delay element having an amount of delay adjusted by the binary code stored in the binary code converter, the coarse delay element having an amount of delay adjusted by the gray code stored in the gray code register.

According to another aspect of the present invention, a semiconductor device including a delay locked loop includes an input buffer receiving an external clock and outputting a first internal clock, a delay circuit delaying the first internal clock to output a second internal clock, a detector detecting a phase difference between the first and second internal clocks, and a gray code counter using a gray code, responsive to an output of the detector for generating a signal adjusting an amount of delay of the delay circuit.

Preferably the gray code counter includes a gray code register storing the gray code, a binary code converter converting the gray code into a binary code, an upward carry/downward carry generator using the binary code stored in the binary code converter, to generate an upward carry signal and a downward carry signal, and a carry multiplexer generating from the upward carry signal and the downward carry signal a carry signal corresponding to a result obtained by the detector, for updating the gray code in the gray code register.

In particular the delay circuit includes a fine delay element and a coarse delay element having an amount of delay greater per unit than the fine delay element, the fine delay element having an amount of delay adjusted by the binary code stored in the binary code converter, the coarse delay element having an amount of delay adjusted by the gray code stored in the gray code register.

Preferably the semiconductor device further includes an input circuit operative in response to the second internal clock for externally receiving a signal or an output circuit operative in response to the second internal clock for externally outputting a signal. In particular the semiconductor device further includes a memory array having a plurality of memory cells, and the output circuit receives a signal for writing/reading data to/from the memory cell array and the output circuit externally outputs data read from the memory cell array.

According to still another aspect of the present invention, a semiconductor device including a delay locked loop includes a first input buffer receiving at least a first external clock and a second external clock complementary in phase to the first external clock, and outputting a first internal clock at the timing of the rising edge of the first external clock when a potential of the first external clock is equal to that of the second external clock, a second input buffer receiving at least the first and second external clocks, and outputting a second internal clock at the timing of the rising edge of the second external clock when a potential of the first external clock is equal to that of the second external clock, a first delay circuit delaying the first internal clock to output a third internal clock, a second delay circuit delaying the second internal clock to output a fourth internal clock, a detector detecting a phase difference between the first and third internal clocks, and a gray code counter using a gray code, responsive to an output of the detector for generating a signal adjusting an amount of delay of the first delay circuit and an amount of delay of the second delay circuit.

Preferably the semiconductor device also includes an output circuit operative in response to the third and fourth internal clocks for externally outputting a signal.

In particular the semiconductor device further includes a memory cell array having a plurality of memory cells, wherein the output circuit is responsive to the third and fourth internal clocks for externally outputting data read from the memory cell array.

According to still another aspect of the present invention, a control method for a system operating in synchronization with a clock, includes the steps of inputting an external clock to an input buffer to generate a first internal clock therefrom, delaying the first internal clock to output a second internal clock, detecting a phase difference between the first and second internal clocks, and using a gray code to determine an amount of delay to be applied in the step of delaying, the amount of delay corresponding to a result obtained in the step of detecting.

Preferably the step of using the gray code includes the steps of converting the gray code into a binary code, using the binary code to generate an upward carry signal and a downward carry signal, and referring to a result obtained in the step of detecting, to generate a carry signal from the upward carry signal and the downward carry signal for updating the gray code.

In particular the present method further includes the step of externally outputting data in response to the second internal clock. Furthermore the present method also includes the step of externally receiving data in response to the second internal clock.

Thus the present DLL circuit employs a gray code counter as a delay register adjusting an amount of delay. This can prevent a carry from arising at more than one bit. Thus the DLL can have a delay value stabilized to minimize skipping of a delay to achieve reliable, rapid operation.

Furthermore the present invention can provide a semiconductor device including a DLL circuit employing a gray code counter as a delay register adjusting an amount of delay when an external clock is delayed to generate an internal clock. Thus skipping of delay can in principle be minimized. As such, using the internal clock to control input and output buffers can provide reliable, rapid operation.

Furthermore the present invention can provide a control method for a system operating in synchronization with a clock, employing a gray code to control an amount of delay to in principle minimize a skipping of delay. Thus data input can be timed in stable manner when it is input. Similarly, data output can be stable.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram for illustrating a 4-bit gray code;

FIG. 2 is a diagram for illustrating an expression converting a 4-bit gray code into a 4-bit binary code;

FIG. 3 illustrates an expression converting an n-bit gray code into an n-bit binary code;

FIG. 4 illustrates a carry in a gray code;

FIG. 29 shows an exemplary configuration of a decoder 70;

DESCRIPTION OF THE PREFERRED EMBODIMENTS

Figure 5:
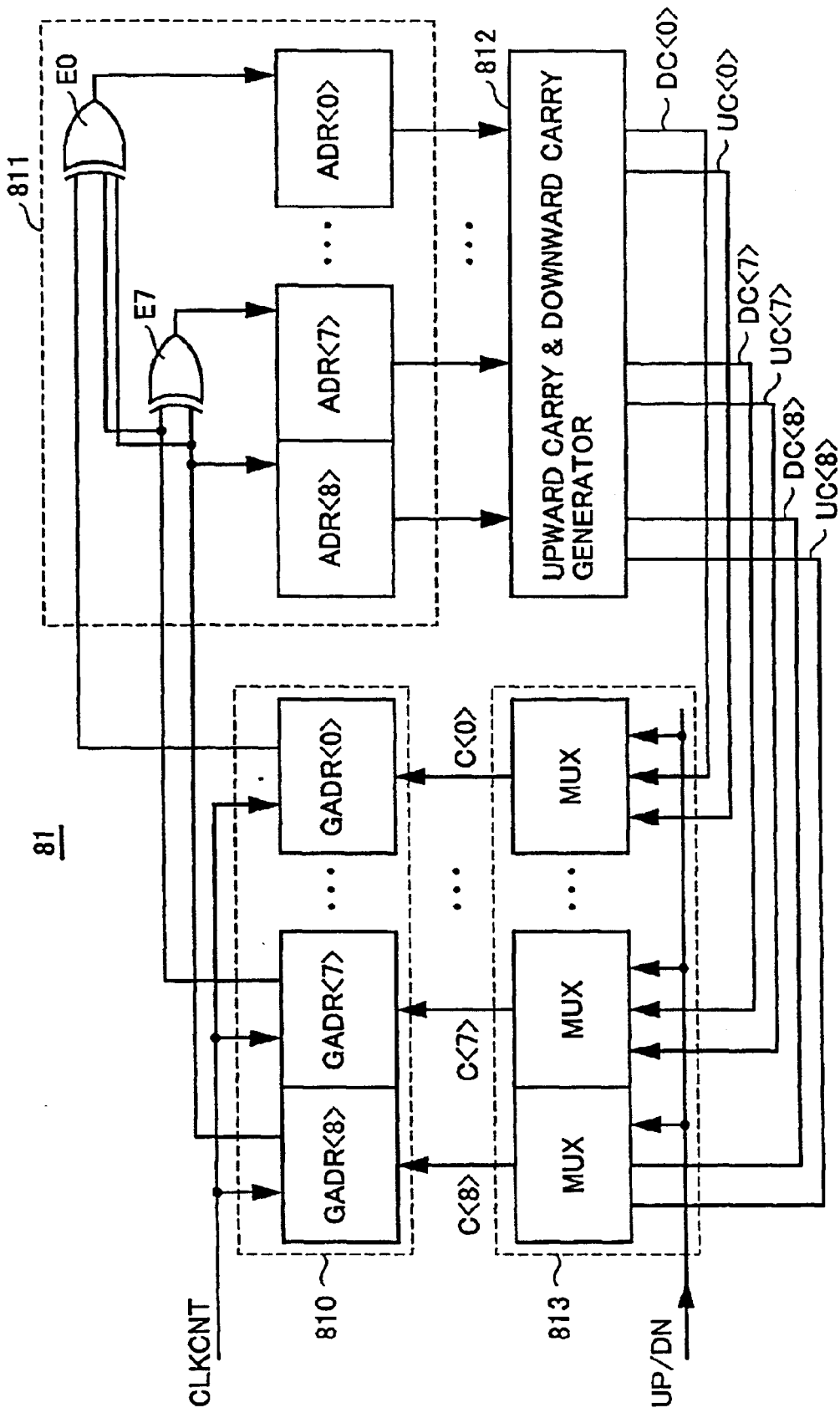
FIG. 5 shows an exemplary configuration of a gray code counter (of nine bits) in a first embodiment of the present invention.

Hereinafter the embodiments of the present invention will be described with reference to the drawings. In the figures like components are labeled like reference characters and will not be described.

First Embodiment

The first embodiment provides a delay locked loop configured to be capable of minimizing delay-skipping. More specifically, the DLL employs a gray code (an alternate code) counter as a delay register.

As such, constantly preventing a carry from arising at more than one bit can minimize skipping of delay time if the metastable state should occur. Hereinafter a reference character GADR refers to a gray code. Furthermore, reference characters GADR<k> refers to a k-th bit in a gray code, referred to as a register value ADR<k> or a gray code GADR<k>.

A 4-bit gray code will now be described with reference to FIG. 1. In FIG. 1 are shown decimal codes, and binary and gray codes corresponding to the decimal codes. In the figure, the upward arrow represents a downward direction and the downward arrow represents an upward direction. Furthermore, reference character ADR represents a binary code and a reference character GADR represents a gray code. A dot indicates a bit of binary and gray codes at which a carry arises.

A gray code is created, as follows: initially, assuming that a decimal code "0" is allotted to a gray code "0000", each bit is assigned in the upward direction to "0" or "1", as will be described hereinafter.

In a gray code a 0-th bit (LSB) repeats 0110 in the upward direction. A first bit repeats 00111100 in the upward direction. A second bit repeats 0000111111110000 in the upward direction. Similarly, an n-th bit repeats "0" 2n times in the upward direction, "1"$2^{(n+1)}$ times in the upward direction and "0" 2n times in the upward direction.

It should be noted that a gray code in FIG. 1 with the n-th bit inverted in logical value also serves as a gray code.

For both of binary and gray codes if an M-th code has an upward carry arising at an i-th bit then an (M+1)-th code has a downward carry also arising at the i-th bit. Thus in FIG. 1 a dot existing between the M-th code and the (M+1)-th code would serve as an upward carry for the M-th code and a downward carry for the (M+1)-th code.

It can be understood that a binary code has more than one bit with a carry arising in both of the upward and downward directions, whereas a gray code has only one bit with a carry arising in each of the upward and downward directions.

For example, a binary code "0110" (decimal code "6") has downward carries arising at the 0-th and first bits, respectively, and an upward carry arising at the 0-th bit. In contrast, a decimal code immediately preceding decimal code "6", i.e., a decimal code "5" (a binary code "0101") has upward carries arising at the 0-th and first bits, respectively, and a decimal code immediately following decimal code "6", i.e., a decimal code "7" (a binary code "0111") has a downward carry arising at the 0-th bit.

In contrast, for example a gray code "0101" (decimal code "6") has a downward carry arising at the first bit and an upward carry arising at the 0-th bit. The immediately preceding decimal code "5" (a gray code "0111") has an upward carry arising at the first bit and the immediately following decimal code "7" (a gray code "0100") has a downward carry arising at the 0-th bit. That is, it can be understood that in a gray code a carry is constantly prevented from arising at more than one bit.

Reference will now be made to FIG. 2 to describe an example of an expression converting a 4-bit gray code into a 4-bit binary code. In FIG. 2 a reference character Exor refers to an exclusive OR. An Exor circuit outputs "1" for an odd number of "1"s of a plurality of signals received thereby and "0" for an even number of "1"s of a plurality of signals received thereby.

For example, Exor (GADR<3>, GADR<2>) is adapted to correspond to binary code ADR<2> and Exor (GADR<3>–GADR<1>) is adapted to correspond to binary code ADR<3>. More specifically in the FIG. 2 expression gray code GADR<3:0> can be converted into binary code ADR<3:0>.

Similarly, reference will now be made to FIG. 3 to describe an expression converting an n-bit gray code into an n-bit binary code. For example, if gray code GADR<n−1> corresponds to a binary code ADR<n−1> and Exor (GADR<n−1> to GADR<n−3>) corresponds to a binary code ADR<n−3>, then the FIG. 3 expression can convert an n-bit gray code into an n-bit binary code.

Reference will now be made to FIG. 4 to describe at which bit a carry arises in a gray code. FIG. 4 shows an example with gray code "0101" corresponding to decimal code "6" (binary code "0110"). In the figure, an arrow represents a relationship between a carry bit and a bit in a binary code.

Gray code "0101" has a downward carry arising at a first bit of the corresponding binary code "0110" that is "1" set closest to the LSB. The gray code also has an upward carry arising at a 0-bit of the corresponding binary code "0110" that is "0" set closest to the LSB.

In general, a gray code has a downward carry arising at a bit of the corresponding binary code that is "1" set closest to the LSB and it has an upward carry arising at a bit of the corresponding binary code that is "0" set closest to the LSB. Thus it can be understood that a gray code has upward and downward carries each prevented from arising at more than one bit.

Reference will now be made to FIG. 5 to describe an exemplary configuration of a gray code counter (of nine bits) in the first embodiment of the present invention. As shown in FIG. 5, a gray code counter 81 includes a gray code register 810, a binary code generator 811, an upward carry and downward carry generator 812 and a carry multiplexer 813.

Gray code register 810 stores 9-bit gray codes GADR<0>–GADR<8>. Binary code generator 811 includes Exor circuits E0–E7.

Binary code generator 811 receives 9-bit gray codes GADR<0>–GADR<8> from gray code register 810 and generates binary codes ADR<0>ADR<8> according to the FIG. 3 expression.

Upward carry and downward carry generator 812 receives binary codes ADR<0>–ADR<8> and according to the FIG. 4 expression generates upward carries UC<0>–UC<8> or downward carries DC<0>–DC<8>.

As has been described above, in upward carries UC<0>–UC<8> only one bit is "1" and the other bits are "0"s. Or in downward carries DC<0>–DC<8> only one bit is "1" and the other are "0"s.

Carry multiplexer 813 includes a plurality of multiplexers, labeled MUX, receiving signals UP and DN each having a logical level inverted relative to each other.

If signal UP is "1" and signal DN is "0", then the counter must be incremented and upward carries UC<0>–UC<8> are put through as carries C<0>–C<8>. In contrast, if signal UP is "0" and signal DN is "1" then the counter must be decremented and downward carries DC<0>–DC<8> are put through as carries C<0>–C<8>.

Figure 6:
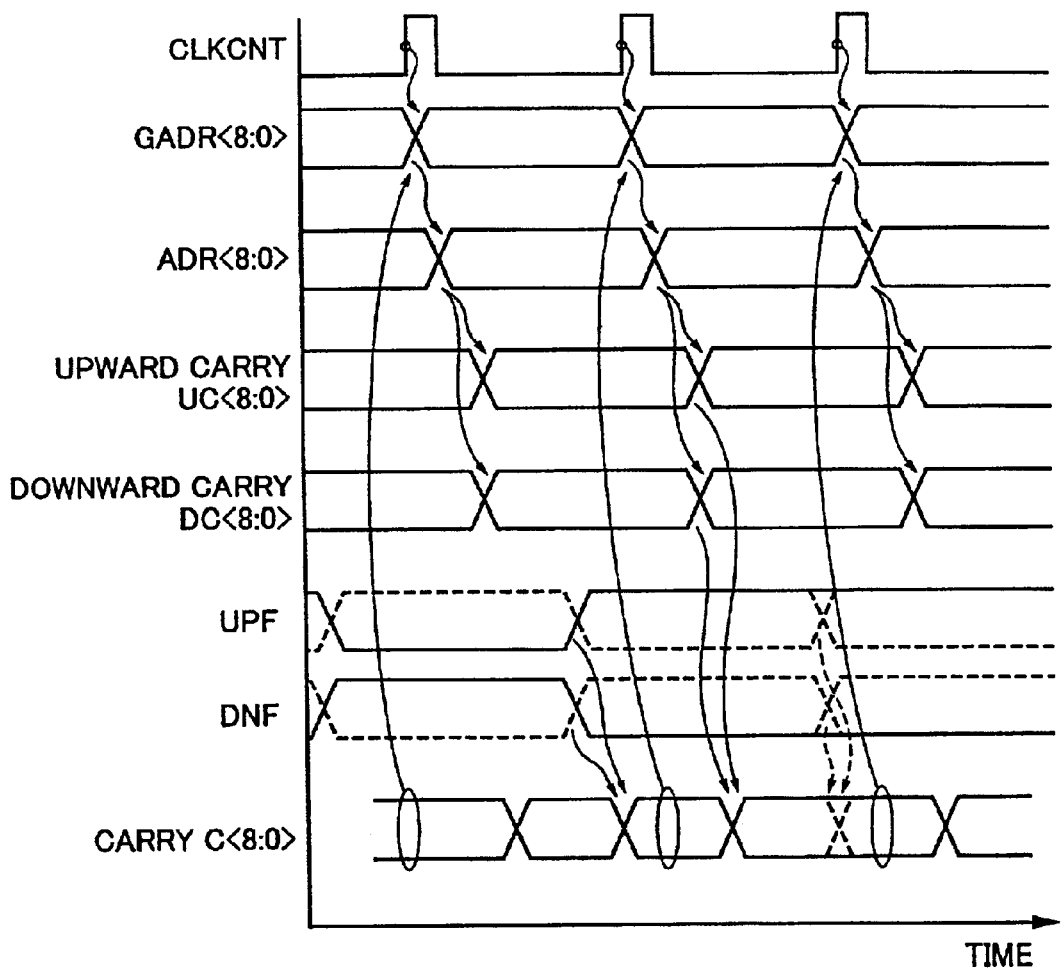
FIG. 6 is timing chart for illustrating a process of occurrence of carries C<0>–C<8>.

Of carries C<0>–C<8> only one bit is "1" and the other bits are all "0"s. The aforementioned carries C<0>–C<8> are produced, as shown in FIG. 6. Carries C<0>–C<8> thus produced are input to gray code register 810. Then at a subsequent timing of counter updating clock CLKCNT one bit of gray codes GADR<0>–GADR<8> is updated to have a new value depending on carries C<0>–C<8>input.

Figure 7:
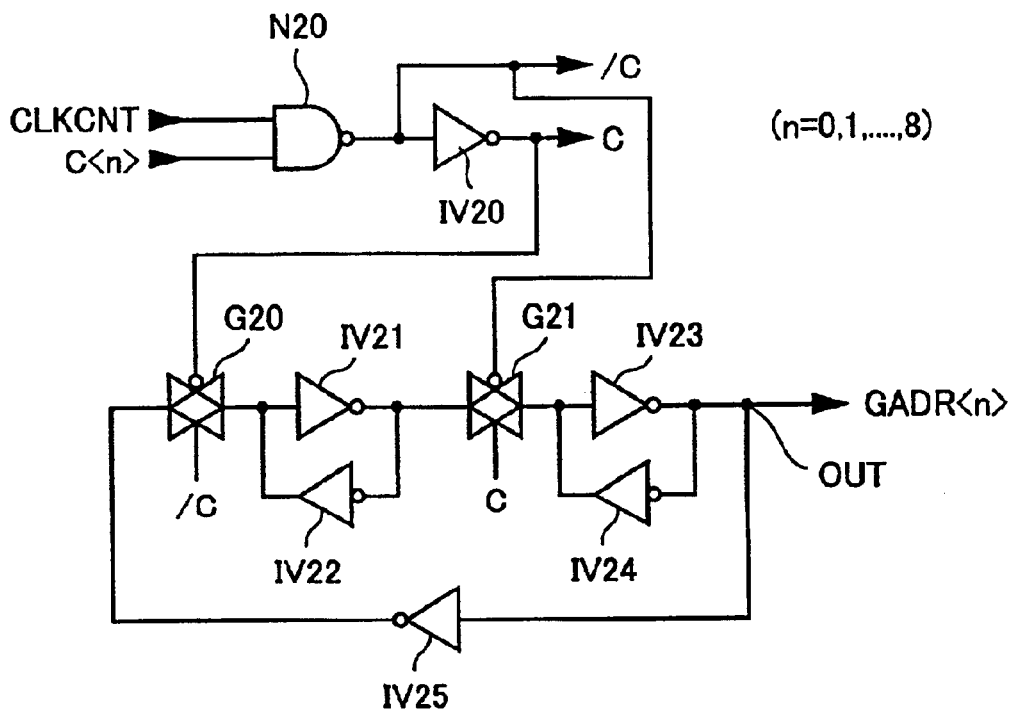
FIG. 7 shows an exemplary circuit configuration of a gray code register 810 in the first embodiment.

Reference will now be made to FIG. 7 to describe an exemplary circuit configuration of gray code register 810 in the first embodiment. FIG. 7 shows a configuration of a register corresponding to gray code GADR<n>, wherein n=0 to 8. It includes an NAND circuit N20, inverters IV20–IV25 and gates G20 and G21.

NAND circuit N20 receives counter updating clock CLKCNT and carry C<n> and outputs a signal /C. Inverter IV20 inverts signal /C to output a signal C.

Inverters IV21 and IV22 configure a latch circuit. Similarly, inverters IV23 and IV24 configure a latch circuit. Gates G20 and G21 are responsive to signals C and /C for putting an input signal through to an output signal or disconnecting an input signal from an output signal.

Inverter IV25 is connected between an output node OUT outputting gray code GADR<n> and gate G20. The latch circuit including inverters IV21 and IV22 is connected between gates G20 and G21. The latch circuit including inverters IV23 and IV24 is connected between gate G21 and node OUT.

Figure 8:
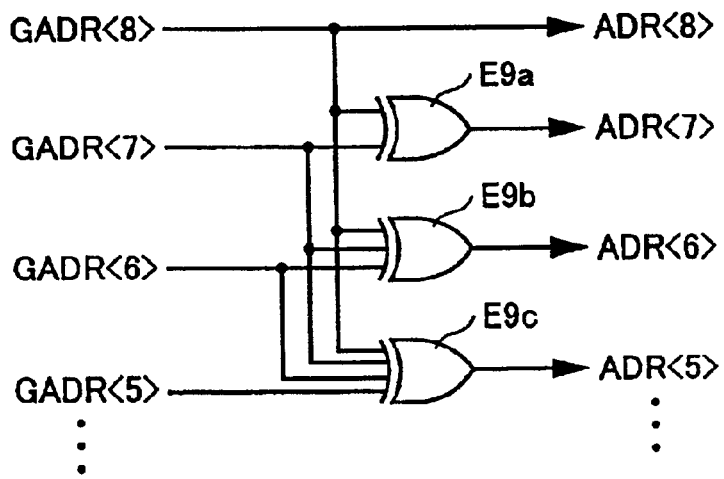
FIG. 8 shows an exemplary circuit configuration of a binary code generator 811 in the first embodiment.

Reference will now be made to FIG. 8 to describe an exemplary circuit configuration of binary code generator 811 in the first embodiment. Binary code generator 811, as shown in FIG. 8, includes EXOR circuits E9a, E9b, E9c, . . . arranged to correspond to the FIG. 3 gray code-binary code conversion expression.

For example, gray code GADR<8> is output as binary code ADR<8>. Gray codes GADR<8> and GADR<7> received by EXOR circuit E9b are output therefrom as binary code ADR<7>. Gray codes GADR<6>–GADR<8> received by EXOR circuit E9c are output therefrom as binary code ADR<6>.

Figure 33:
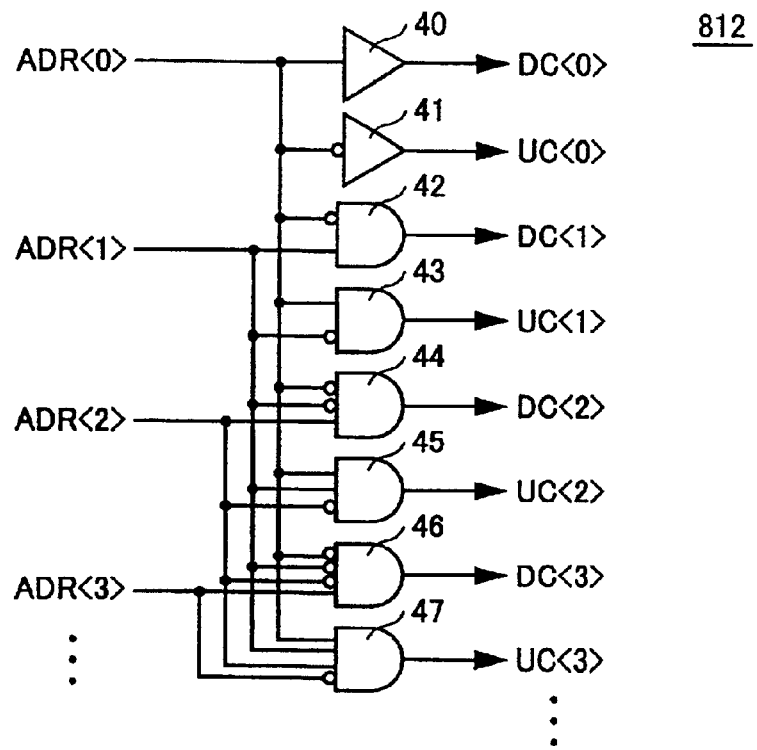
FIG. 33 shows an exemplary circuit configuration of an upward carry and downward carry generator 812 in the first embodiment.

Reference will now be made to FIG. 33 to describe an exemplary circuit configuration of upward carry and downward carry generator 812 in the first embodiment. Upward carry and downward carry generator 812, as shown in FIG. 33, includes a plurality of logic circuits 40, 41, 42, . . . arranged according to the FIG. 4 system employed to find out the location of a carry bit. Upward carry and downward carry generator 812 outputs downward carries DC<0>, DC<1>, and upward carries UC<0>, UC<1>, . . . .

Figure 34:
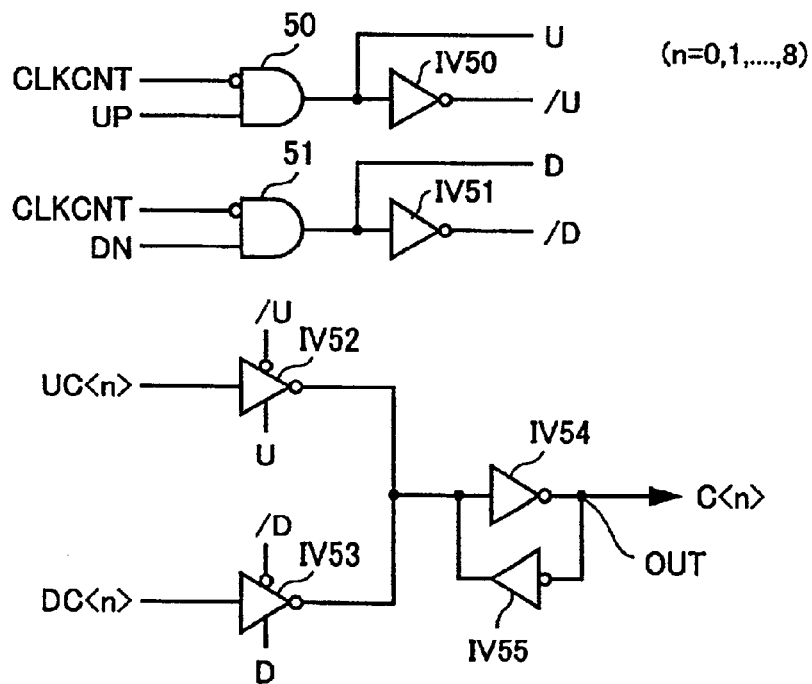
FIG. 34 shows an exemplary circuit configuration of a carry multiplexer 813 in the first embodiment.

Reference will now be made to FIG. 34 to describe an exemplary circuit configuration of carry multiplexer 813 in the first embodiment. FIG. 34 shows a multiplexer corresponding to carry C<n>, wherein n=0 to 8. This multiplexer, as shown in FIG. 34, includes logic circuits 50 and 51 and inverters IV50–IV55.

Logic circuit 50 receives counter updating clock CLKCNT and signal UP and outputs a signal U. Inverter IV50 outputs an inverted version of signal U, i.e., a signal /U. Signal U goes high only when signal UP has a high level and counter updating clock CLKCNT has a low level.

Logic circuit 51 receives counter updating clock CLKCNT and signal DN and outputs a signal D. Inverter IV51 outputs an inverted version of signal D, i.e., a signal /D. Signal D goes high only when signal DN has a high level and counter updating clock CLKCNT has a low level.

When signal U goes high (or signal IU is driven low) inverter IV52 inverts upward carry UC<n> and outputs the inverted carry. When signal D goes high (or signal /D is driven low) inverter IV 53 inverts downward carry DC<n> and outputs the inverted carry.

Inverters IV54 and IV55 configure a latch circuit arranged between an output node of inverters IVs 52 and 53 and node OUT. From node OUT carry C<n> is output.

Figure 9:
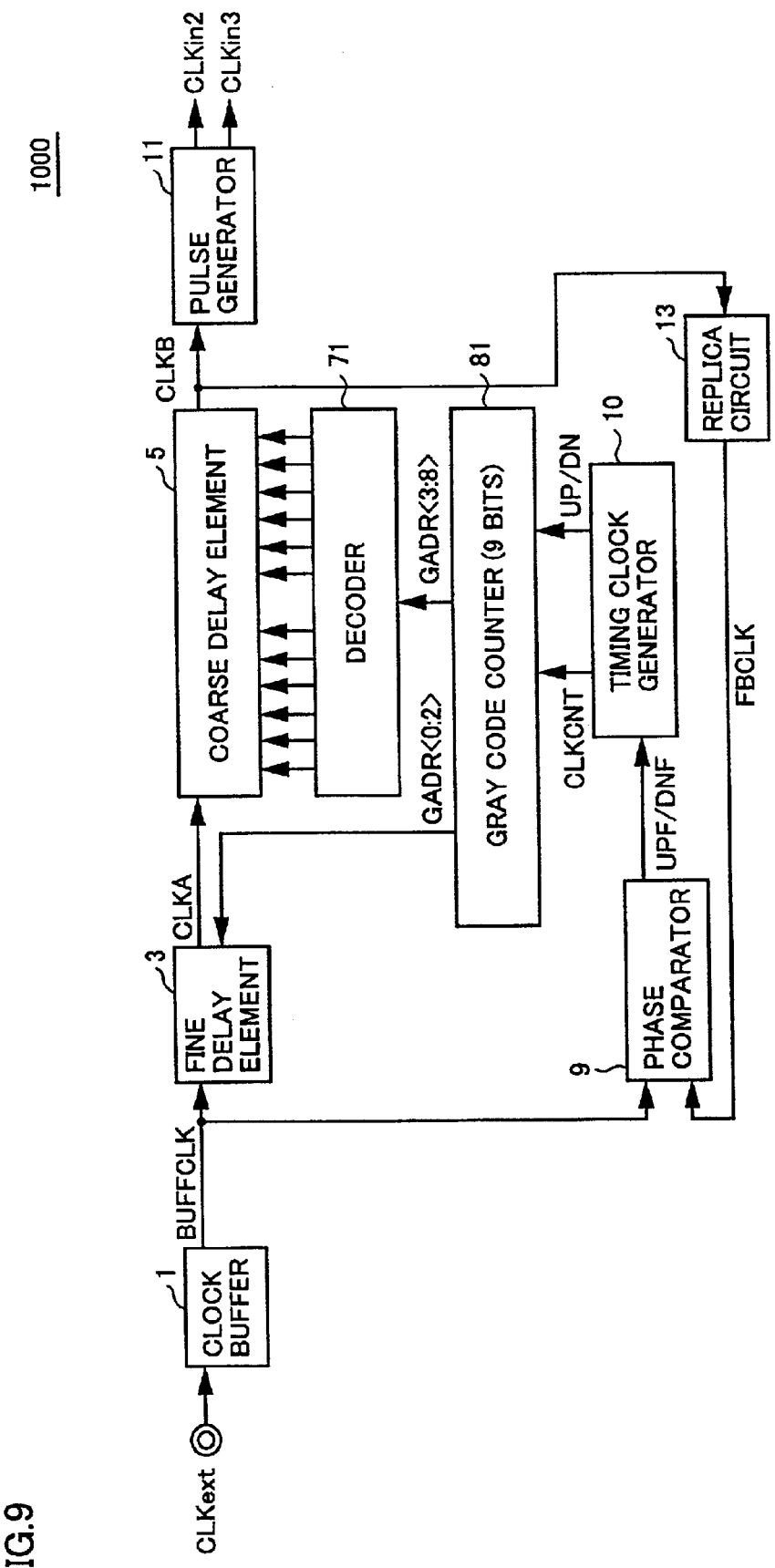
FIG. 9 shows a general configuration of a DLL 1000 in the first embodiment.

Reference will now be made to FIG. 9 to describe a general configuration of DLL 1000 of the first embodiment. DLL 1000, as shown in FIG. 9, includes a clock buffer 1, a fine delay element 3, a coarse delay element 5, a decoder 71, a gray code counter 81, a phase comparator 9, a timing clock generator 10, a pulse generator 11 and a replica circuit 13.

DLL 1000 is distinguished from conventional DLL 9000 in that the former DLL includes gray code counter 81 rather than binary counter 80 and accordingly includes decoder 71 rather than decoder 70.

Gray code counter 81, in response to counter updating clock CLKCNT and based on signal UP/DN, outputs binary code ADR<0:2> and gray code GADR<3:8>.

Decoder 71 decodes gray code GADR<3:8> to output a signal which determines the number of delay stages of coarse delay element 5.

Figure 10:
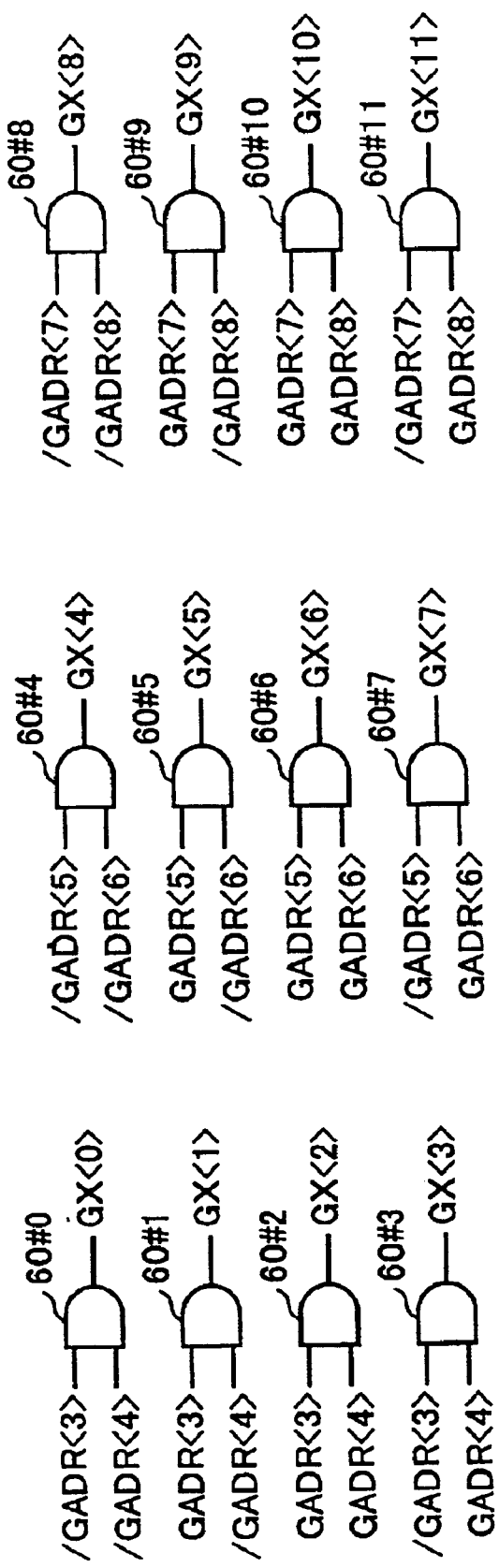
FIGS. 10–12 show components of a decoder 71 in the first embodiment.
Figure 11:
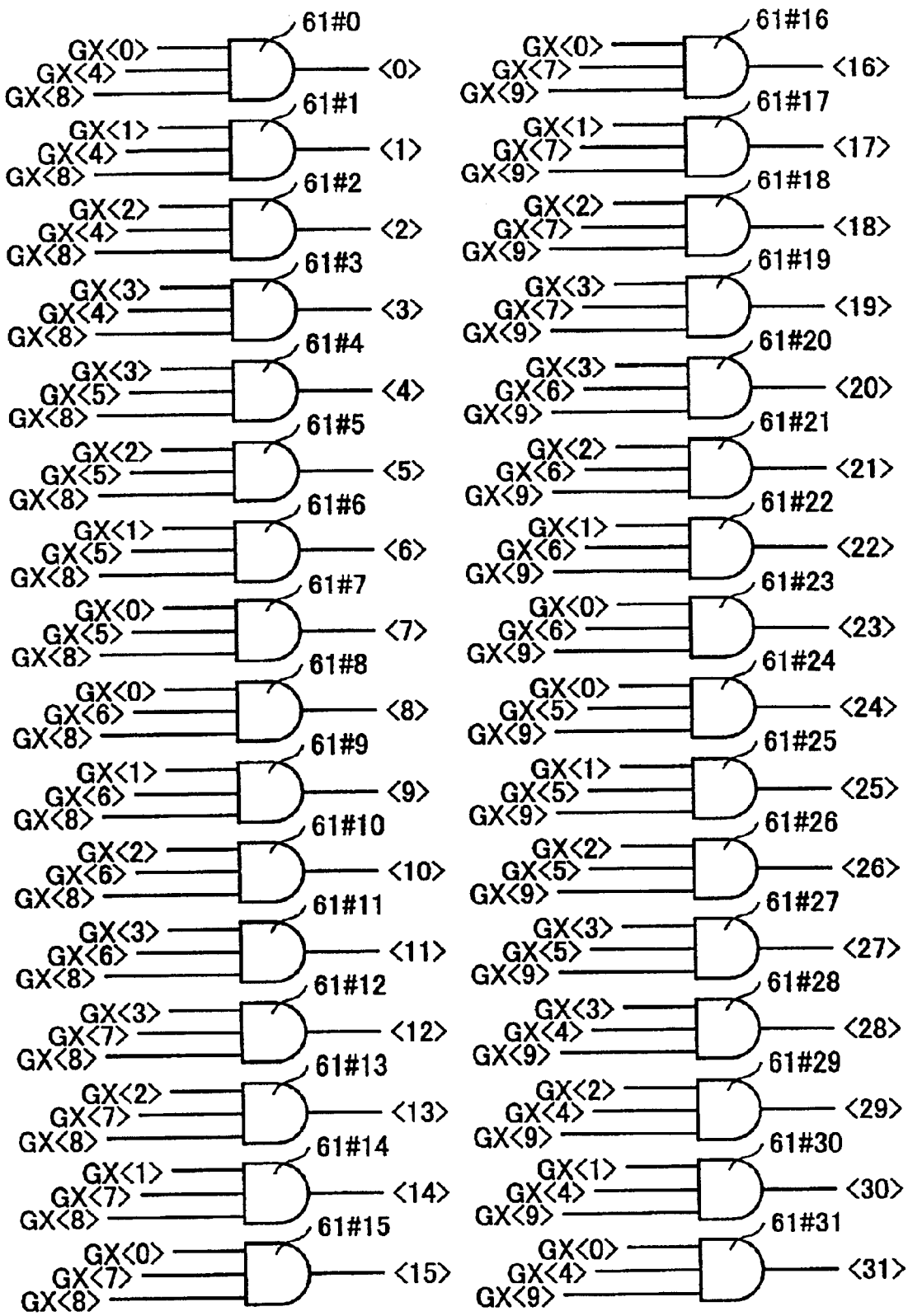
Figure 12:
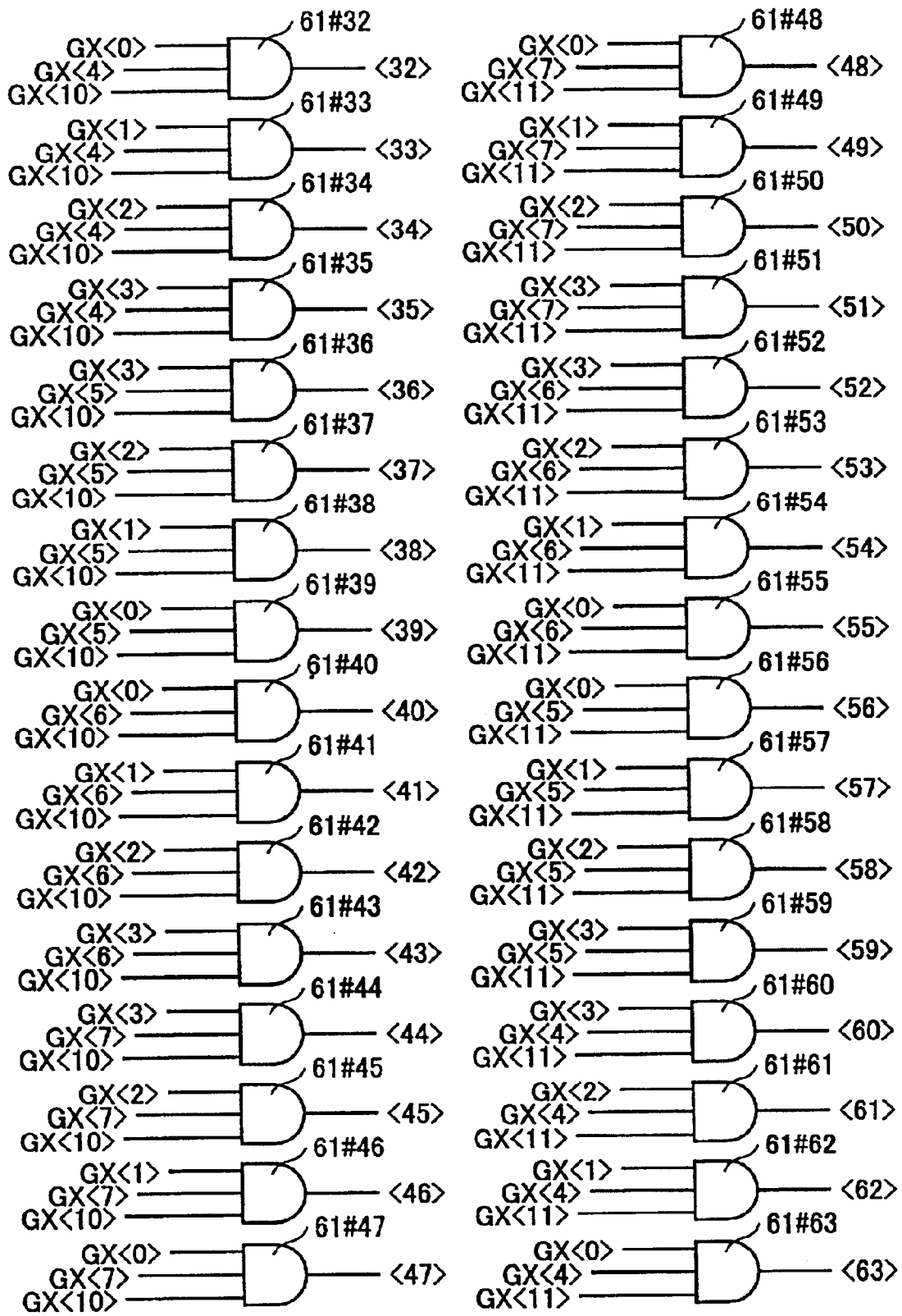

Reference will now be made to FIGS. 10–12 to describe an exemplary configuration of decoder 71. As shown in FIGS. 10–12, decoder 71 includes an AND circuit 60#k outputting a signal GX<k>, wherein k=0 to 11, and AND circuits 61#0–61#63 outputting a signal which determine the number of delay stages of coarse delay element 5 depending on signal GX<k>.

AND circuit 60#i×4 receives a gray code /GADR<3+i× 2>, an inverted version of a gray code GADR<3+i×2>, and a gray code /GADR<4+i×2>, an inverted version of a gray code GADR<4+i×2>, and AND circuit 60#(i×4+1) receives gray codes GADR<3+i×2> and /GADR<4+i×2>, wherein i=0, 1, 2.

AND circuit 60#(i×4+2) receives gray codes GADR<3+ i×2> and GADR<4+i×2> and AND circuit 60#(i×4+3) receives gray codes GADR<3+i×2> and GADR<4+i×2>.

AND circuits 61#0–61#63 each have first, second and third input nodes. AND circuits 61#(8×i) and 61#(8×i+7) have their respective first nodes receiving a signal GX<0>, AND circuits 61#(8×i+1) and 61#(8×i+6) have their respective first input nodes receiving a signal GX<1>, AND circuits 61#(8×i+2) and 61#(8×i+5) have their respective first input nodes receiving a signal GX<2>, and AND circuits 61#(8×i+3) and 61#(8×i+4) have their respective first input nodes receiving a signal GX<3>, wherein i=0 to 7.

AND circuits 61#0×32+0) to 61#0×32+3) and 61#0×32+ 28) to 61#0×32+31) have their respective second input nodes receiving a signal GX<4>, AND circuits 61#0×32+4) to 61#0×32+7) and 61#0×32+24) to 61#0×32+27) have their respective second input nodes receiving a signal GX<5>, AND circuits 61#0×32+8) to 61#0×32+11) and 61#0×32+ 20) to 61#0×32+23) have their respective second input nodes receiving a signal GX<6>, and AND circuits 61#(0× 32+12) to 61#0×32+15) and 61#0 ×32+16) to 61#0×32+19) have their respective second input nodes receiving a signal GX<7>, wherein j=0, 1.

AND circuits 61#0–61#15 have their respective third input nodes receiving a signal GX<8>, AND circuits 61#16–61#31 have their respective third input nodes receiving a signal GX<9>, AND circuits 61#32–61#47 have their respective third input nodes receiving a signal GX<10>, and AND circuits 61#48–61#63 have their respective third input nodes receiving a signal GX<11>.

In response to the output from AND circuit 61#m the number of delay stages (m delay stages, for example) of coarse delay element 5 is determined, wherein m=0 to 63.

Figure 13:
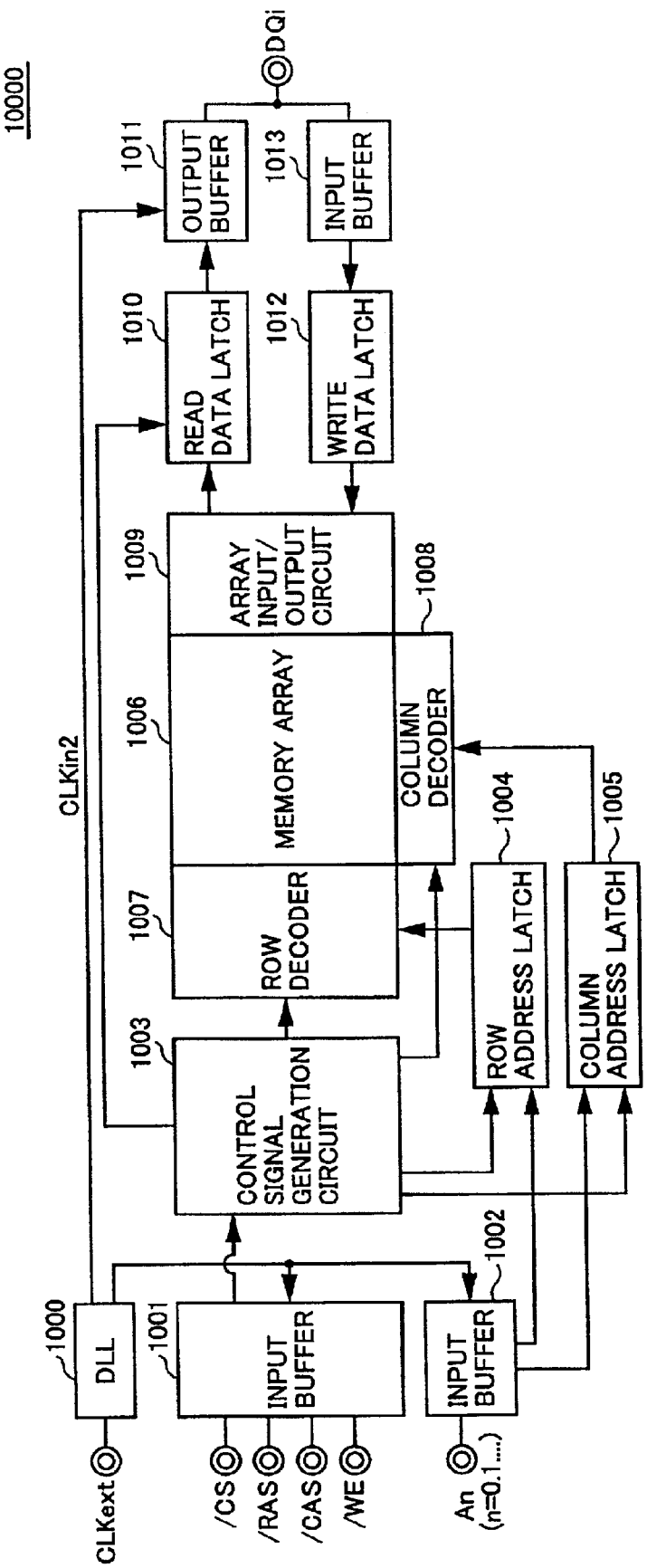
FIG. 13 shows an exemplary configuration of a semiconductor device 10000 having the DLL 1000 of the first embodiment.

Reference will now be made to FIG. 13 to describe an exemplary configuration of a semiconductor device 10000 having DLL 1000 of the first embodiment. Semiconductor device 10000, as shown in FIG. 13, includes DLL 1000 receiving external clock CLKext, an input buffer 1001 receiving control signals (a row address strobe signal /RAS, a column address strobe signal /CAS, a chip select signal /CS, a write enable signal /WE and the like), an input buffer 1002 receiving an address signal An, wherein n=0, 1, ..., a control signal generation circuit 1003 receiving an output of input buffer 1001 to generate an internal control signal, a row address latch 1004 responsive to the internal control signal for latching a row address output from input buffer 1002, a column address latch 1005 responsive to the internal control signal for latching a column address output from input buffer 1002, a memory array 1006 having a plurality of memory cells arranged in rows and columns, and a plurality of word lines arranged in the direction of the rows and a plurality of bit lines arranged in the direction of the columns, a row decoder 1007 responsive to the internal control signal for selecting a row corresponding to an output of row address latch 1004, and a column decoder 1008 responsive to the internal control signal for selecting a column corresponding to an output of column address latch 1005.

Input buffers 1001 and 1002 take a received signal in in synchronization with clock BUFFCLK (or CLKin3) output from DLL 1000. Clock CLKin3 is more suitable for rapid operation than clock BUFFCLK.

Semiconductor device 10000 also includes an array input/output circuit 1009 provided to read or write data from or to memory array 1006, a read-data latch 1010 responsive to the internal control signal for latching read data, an output buffer 1011 taking in data latched by read-data latch 1010, and outputting the data to a data input/output terminal DQi, a write-data latch 1012 latching data to be written, and an input buffer 1013 taking data in from data input/output terminal DQi and outputting data to be written to write-data latch 1012.

Output buffer 1011 operates in synchronization with internal clock CLKin2 output from DLL 1000.

The DLL including the gray code counter of the first embodiment is effective as follows. In the FIGS. 1 and 2 examples (a 4-bit gray code), for example, as has been described previously, in the gray code counter a carry arises only for one bit for both of "UP" and "DOWN".

Assuming that the current register value is decimal code "6", which is equal to gray code "0101", if signal UP has a high level then carry C<0> is "1" and carries C<1>–C<3> are "0"s. In contrast, if signal DN has a high level then carry C<1> is "1" and carries C<0>, C<2>, C<3> are "0"s. If herein the metastable state occurs in phase comparator 9 and signals UP and DN are thus not ascertained in value, each carry has a value, as follows:

Carries C<2> and C<3> are "0"s whichever one of signals UP and DN has a high level. As such, even if neither signals UP nor DN are ascertained carries C<2> and C<3> are ascertained and hold "0"s.

Carries C<0> and C<1> have a value of "0" or "1" depending on the values of signals UP and DN. Thus, if neither signals UP nor DN are ascertained neither carries C<0> nor C<1> are ascertained. This results in the following four results with any of the probabilities:

(1) When carry C<0> is "0" and carry C<1> is "0" all of the carries are "0"s and a subsequent register value is still decimal code 6, which is equal to gray code 0101.

(2) When carry C<0> is "1" and carry C<1> is "0" a subsequent register value is decimal code 7, which is equal to gray code 0100.

(3) When carry C<0> is "0" and carry C<1> is "1" a subsequent register value is decimal code 5, which is equal to gray code 1111.

(4) When carry C<0> is "1" and carry C<1> is "1" a subsequent register value is decimal code 4, which is equal to gray code 0110.

As represented in this example, after the metastable state has occurred the current state "6" can transition only to "4", "5", "6", "7". In other words, it only transitions to a value distant therefrom at most by "2".

Although in the above description an initial state is "6", it can be understood that any initial state having a value other than "6" only transitions to a value distant therefrom at most by "2".

This also applies not only to a 4-bit gray code counter but general n-bit gray code counters.

Since the gray code counter is used, an initial register value only jumps to a register value distant therefrom at most by two if the metastable state occurs. In contrast, if a conventional binary counter is used a current register value might jump to an unexpected register value. It can thus be understood that the present invention is significantly effective.

Thus if a DLL includes the gray code counter the DLL can effectively have a delay value stabilized to minimize delay-skipping to eliminate the possibility that such a defect as observed in the conventional example will occur.

Second Embodiment

Figure 14:
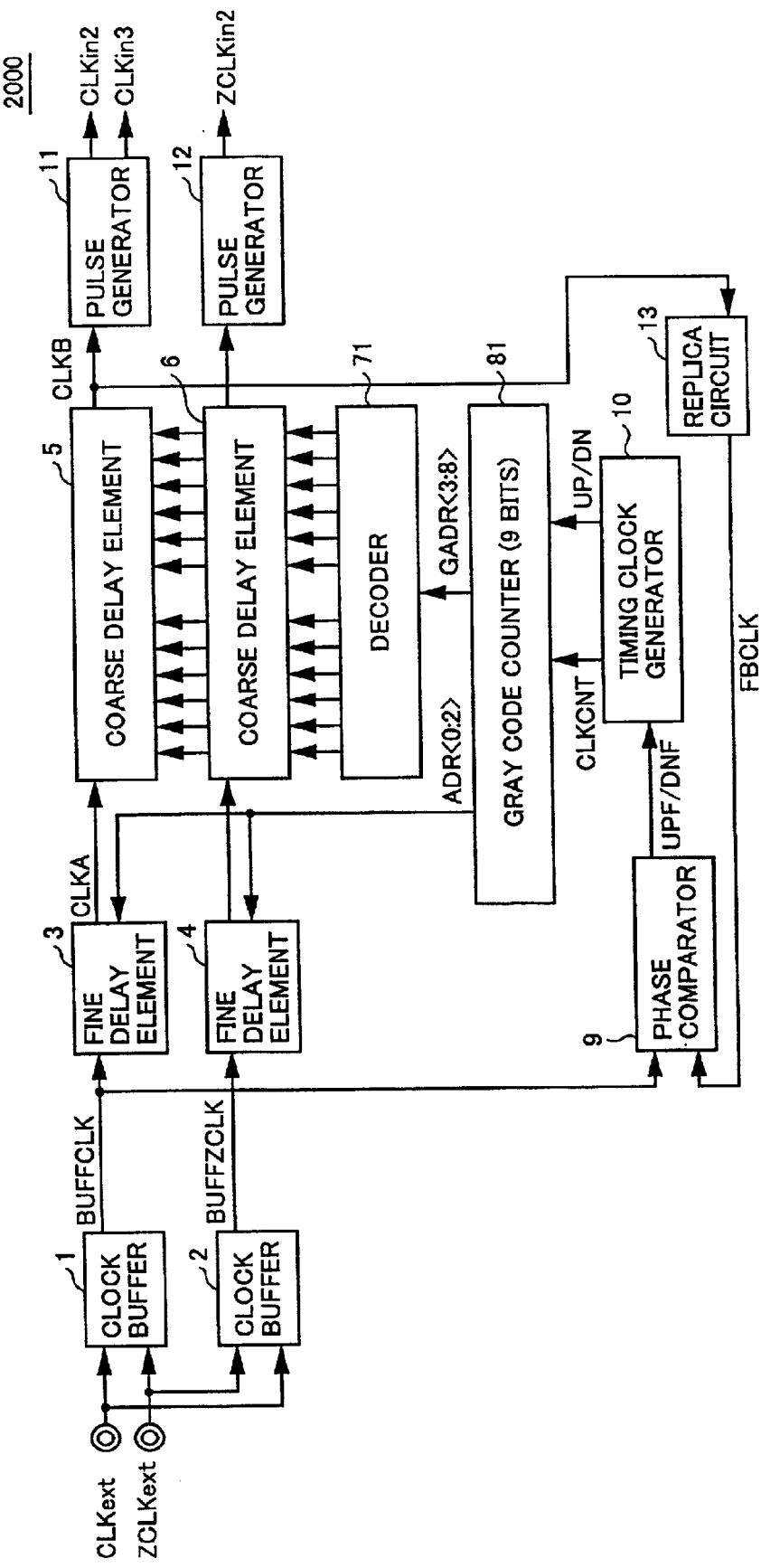
FIG. 14 shows a general configuration of a DLL 2000 in a second embodiment of the present invention.

In the second embodiment a DLL to be mounted on a DDR-SDRAM will be described. Reference will be made to FIG. 14 to describe a DLL 2000 for a DDR-SDRAM. DLL 2000, as shown in FIG. 14, externally receives clocks CLKext and ZCLKext having their respective phases different by 180° from each other.

DLL 2000 includes clock buffers 1 and 2, fine delay elements 3 and 4, coarse delay elements 5 and 6, a decoder 71, a gray code counter 81, a phase comparator 9, a timing clock generator 10, pulse generators 11 and 12, and a replica circuit 13.

Fine delay element 4 is identical in configuration to fine delay element 3 and coarse delay element 6 is identical in configuration to coarse delay element 5. Furthermore pulse generator 12 is identical in configuration to pulse generator 11.

Figure 31:
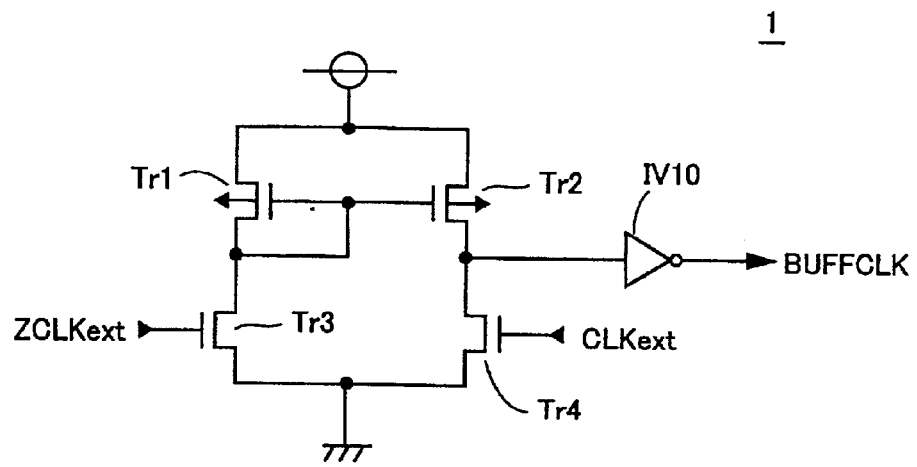
FIG. 31 shows an exemplary configuration of a clock buffer 1.
Figure 32:
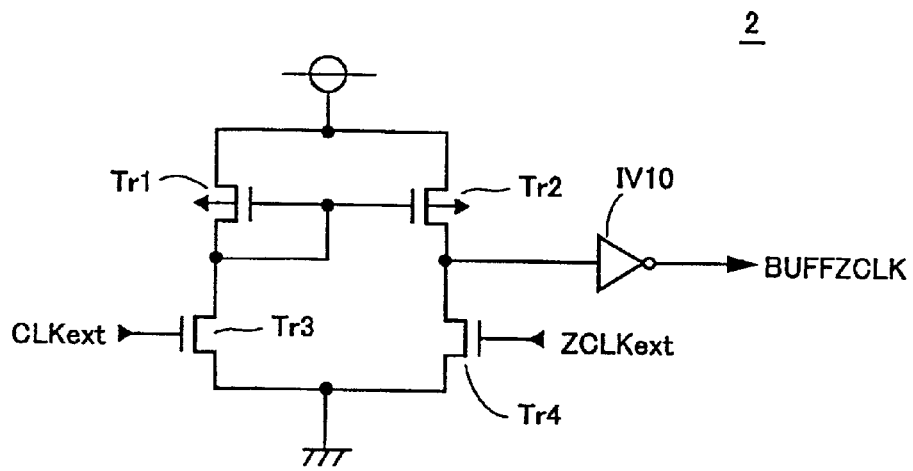
FIG. 32 shows an exemplary configuration of a clock buffer 2.

Clock buffers 1 and 2 both receive external clocks CLKext and ZCLKext. Clock buffers 1 and 2, as shown in FIGS. 31 and 32, include transistors Tr1, Tr2, Tr3, Tr4 and an inverter IV10. Clock buffers 1 and 2 output clocks BUFFCLK and BUFFZCLK, respectively.

Phase comparator 9 compares a phase of clock FBCLK output from replica circuit 13 and that of clock BUFFZCLK to output a signal UPF/DNF. Gray code counter 81 outputs binary code ADR<0:2> which is in turn input to fine delay elements 3 and 4.

Decoder 71 decodes gray code GADR<3:8> output from gray code counter 81 and outputs it to coarse delay elements 5 and 6.

Clock BUFFZCLK passes through fine delay element 4 and coarse delay element 6 and is then input to pulse generator 12, which outputs clock ZCLKin2, which is used as well as internal clock CLKin2 for the DDRSDRAM to output data.

Figure 15:
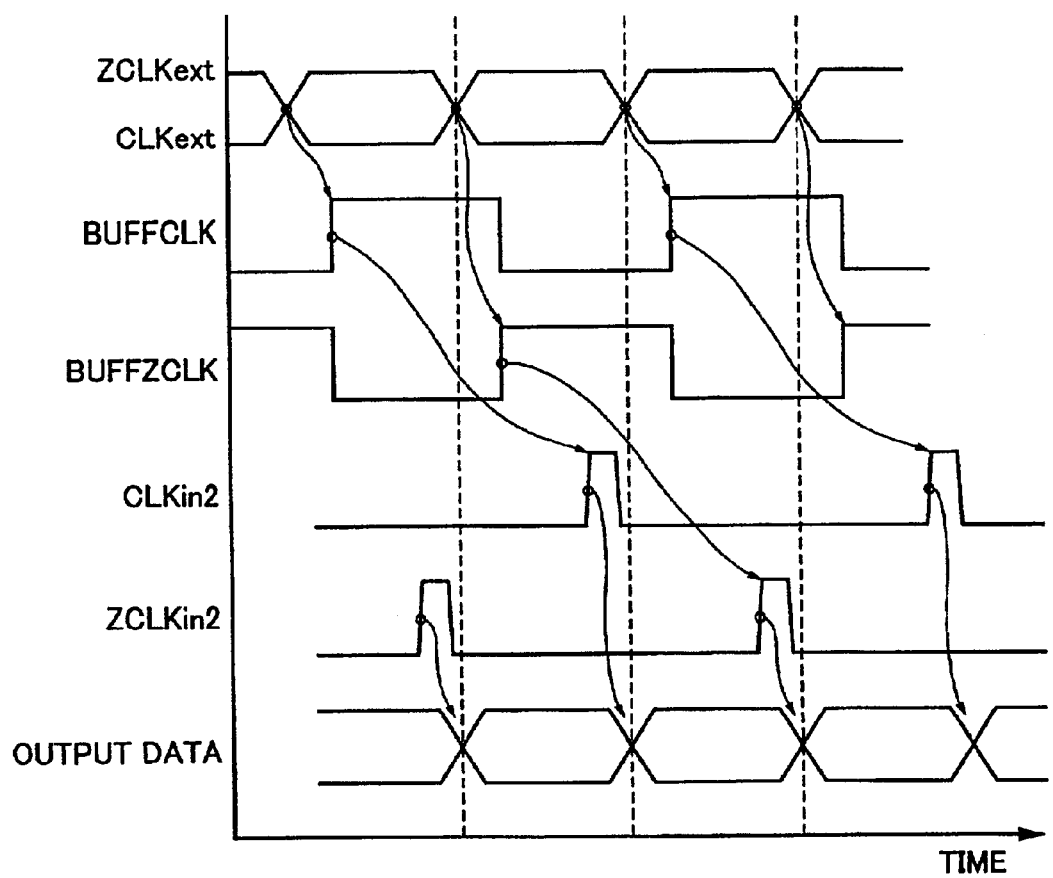
FIG. 15 is timing chart for illustrating an operation of DLL 2000 of the second embodiment.

DLL 2000 operates as described with reference to FIG. 15. With reference to FIG. 15, signal BUFFCLK is produced by clock buffer 1 at a point with a rising of clock CLKext and a falling of clock ZCLKext crossing each other. Clock BUFFZCLK is produced by clock buffer 2 at a point with a rising of clock ZCLKext and a falling of clock CLKext crossing each other.

Internal clock CLKin2 is used for outputting data in synchronization with a point with a rising of external clock CLKext and a falling of external clock ZCLKext crossing each other. Internal clock ZCLKin2 is used for outputting data in synchronization with a point with a rising of external clock ZCLKext and a falling of external clock CLKext crossing each other.

Figure 16:
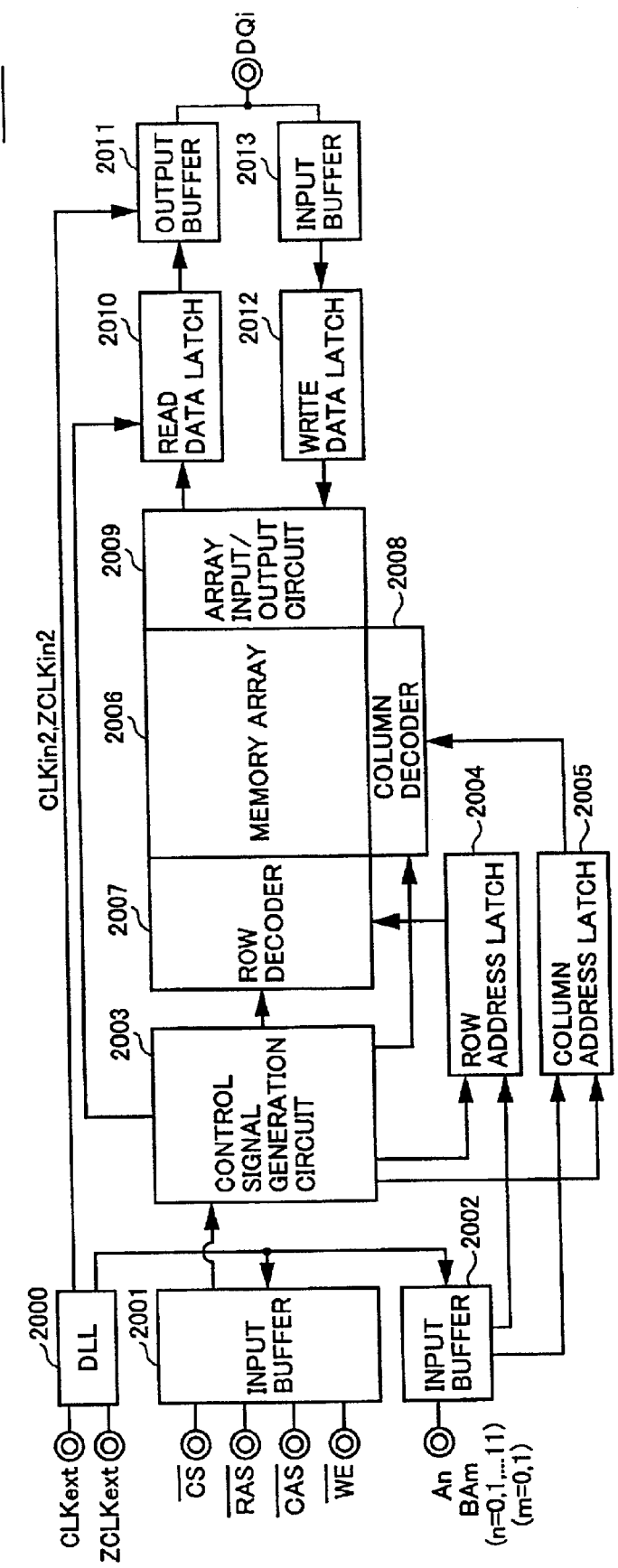
FIG. 16 shows an exemplary configuration of a semiconductor device 20000 having the DLL 2000 of the second embodiment.
Figure 17:
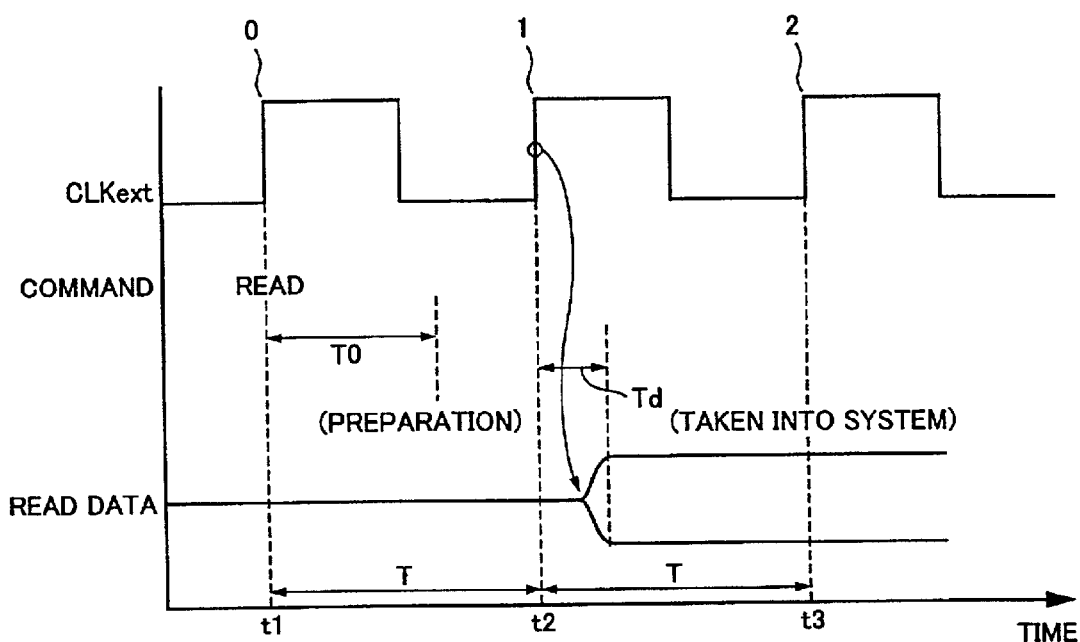
FIGS. 17 and 18 are timing charts for illustrating a timing at which data is output.
Figure 18:
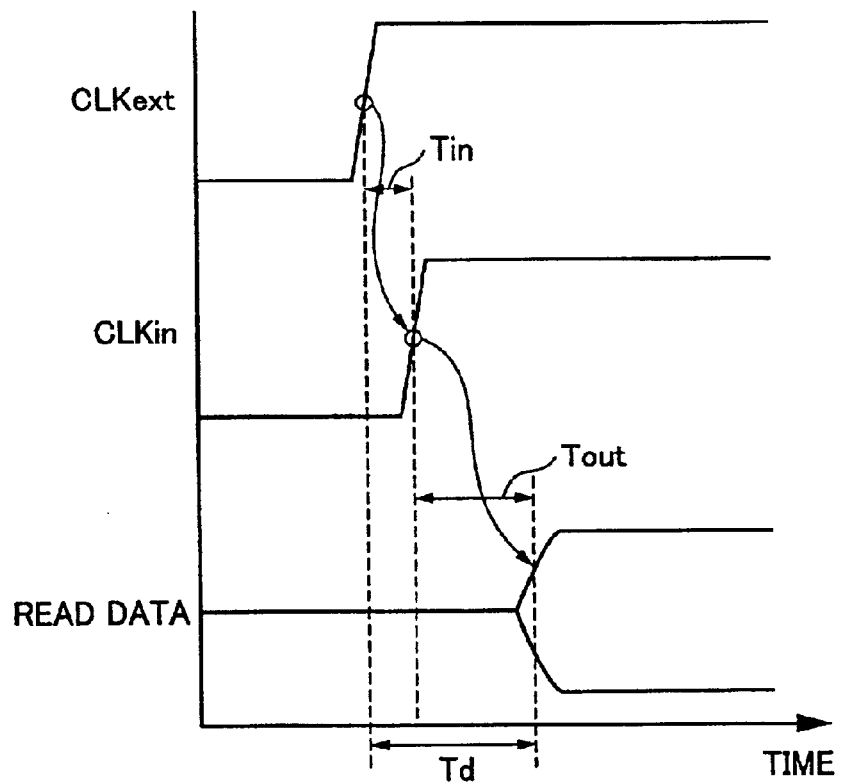
Figure 19:
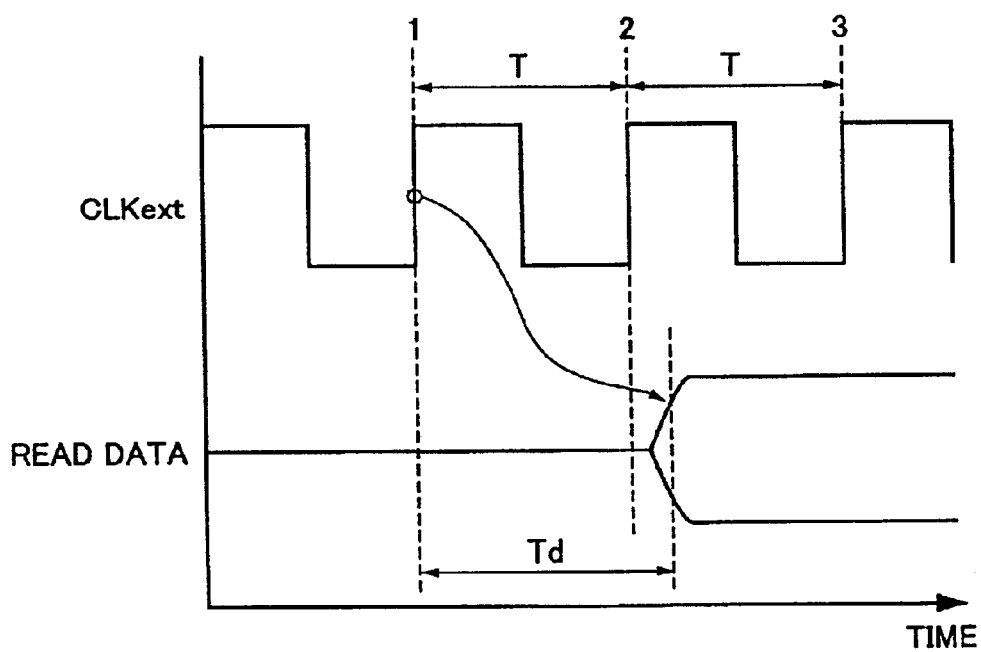
FIG. 19 is timing chart for illustrating a problem occurring when a system clock period T is short.
Figure 20:
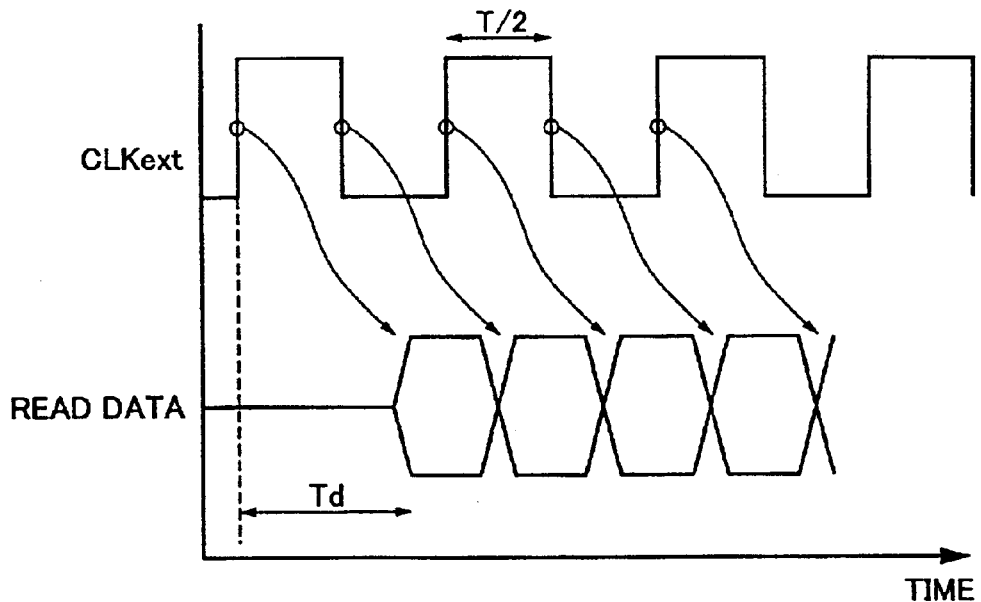
FIG. 20 is timing chart for illustrating a timing at which a DDRSDRAM operates.
Figure 21:
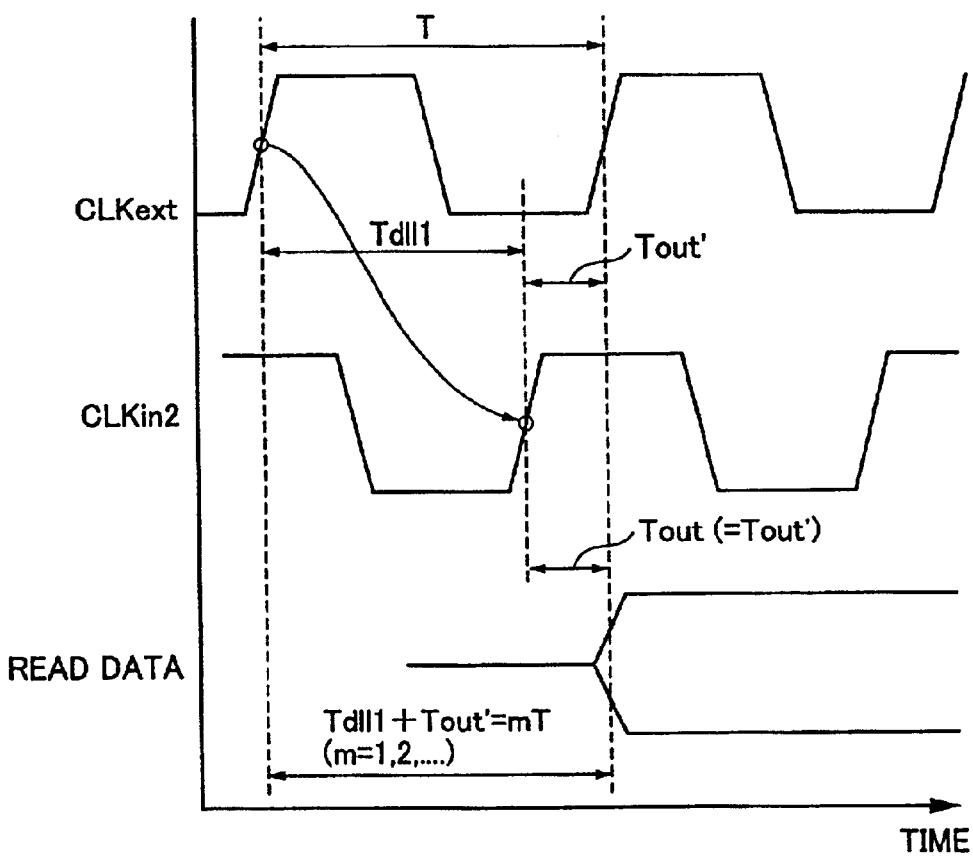
FIG. 21 is timing chart for illustrating an operation of a component employing a DLL.
Figure 22:
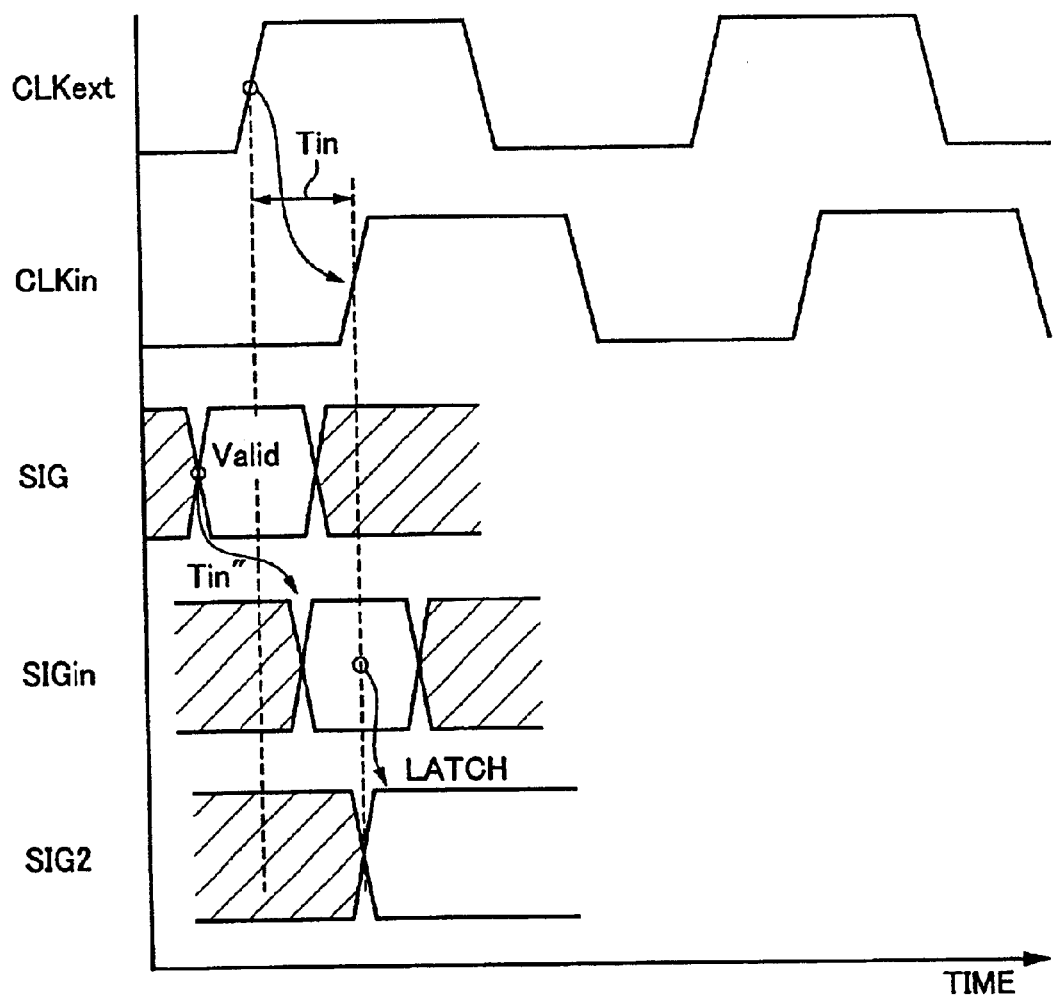
FIG. 22 is timing chart for illustrating an operation in inputting data when no DLL is used.
Figure 23:
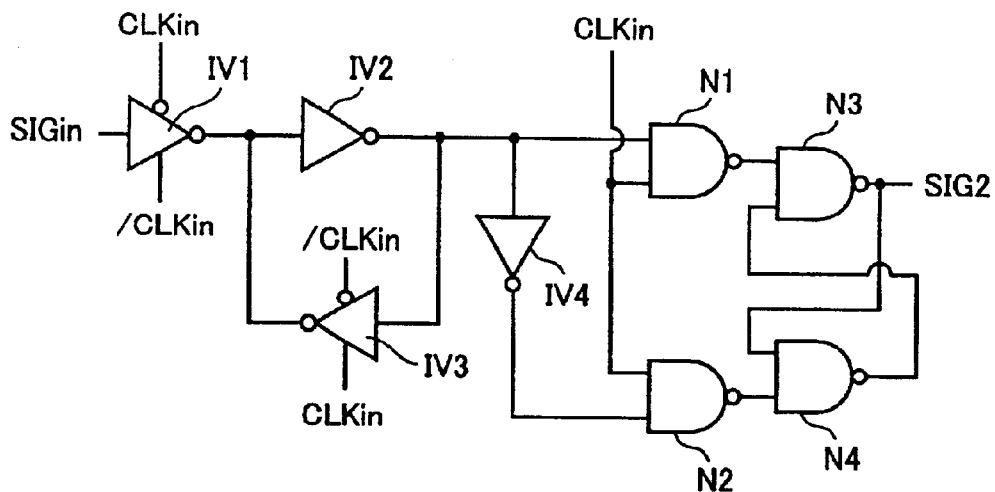
FIG. 23 shows an exemplary configuration of a latch circuit 910.
Figure 24:
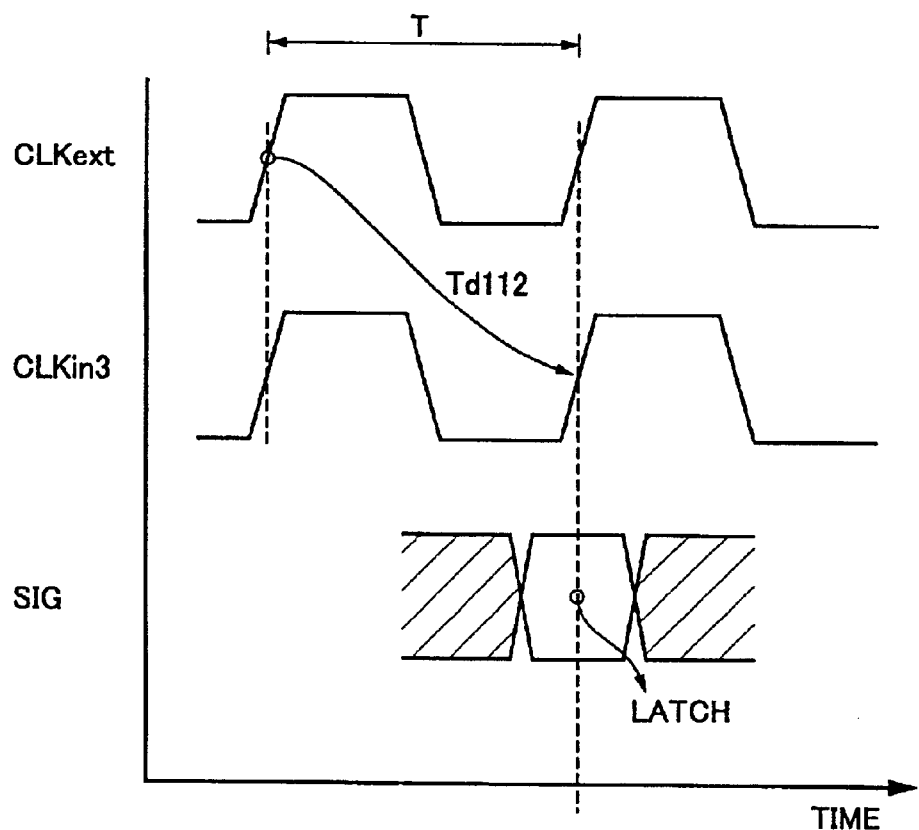
FIG. 24 is timing chart for illustrating an operation in inputting data when a DLL is used.
Figure 25:
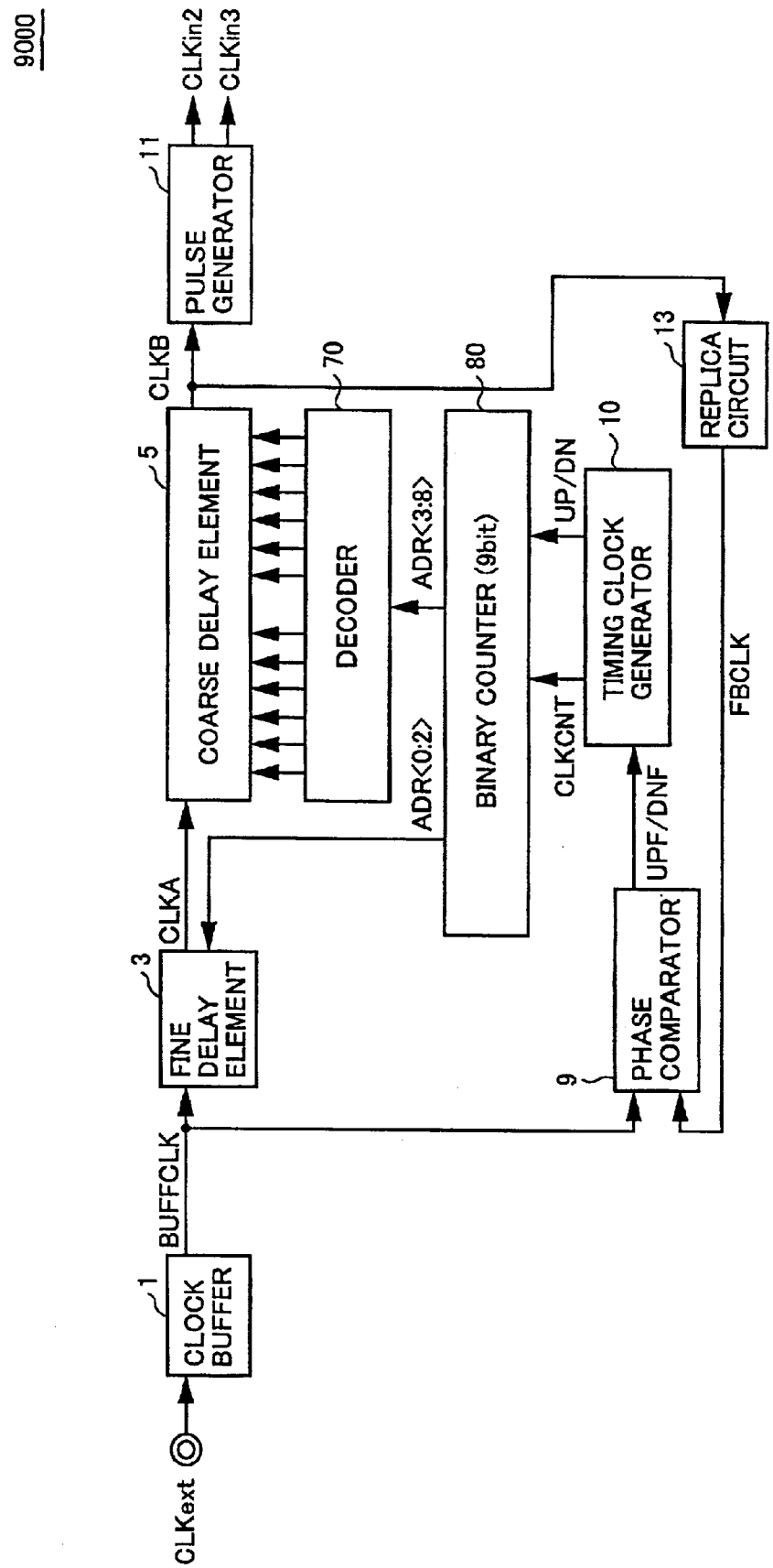
FIG. 25 shows an exemplary configuration of a conventional DLL 9000.
Figure 26:
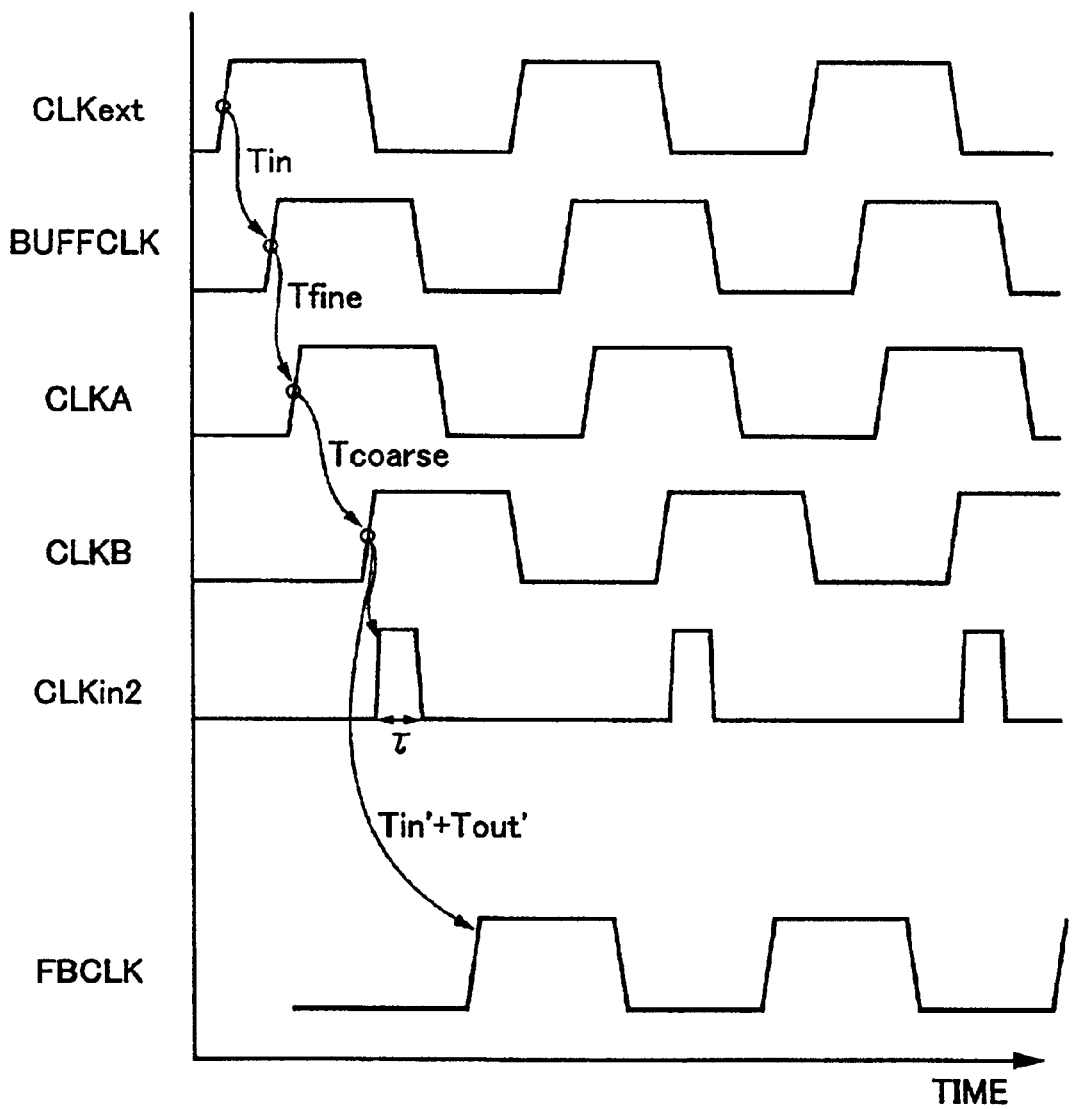
FIG. 26 is timing chart for illustrating an operation of DLL 9000.
Figure 27:
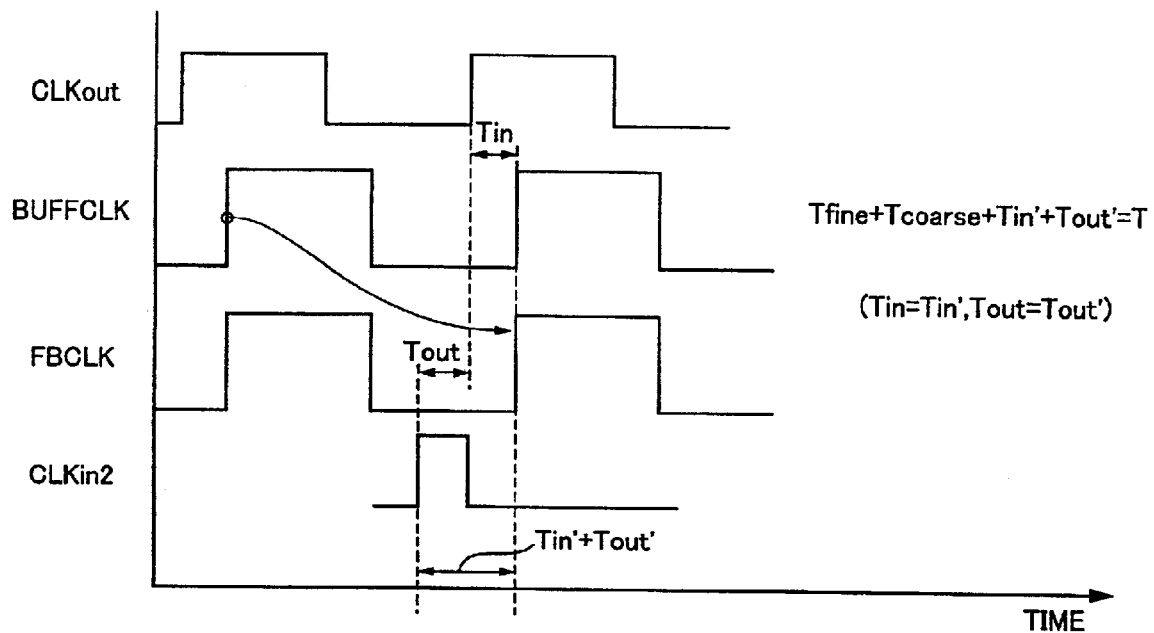
FIG. 27 is timing chart for illustrating an operation of DLL 9000.
Figure 28A:
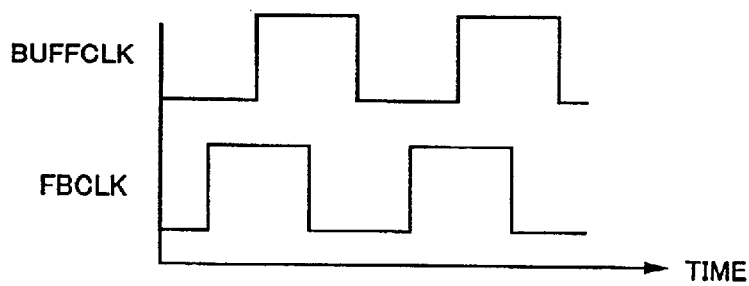
FIGS. 28A and 28B are timing charts for illustrating signals UPF and DNF values.
Figure 28B:
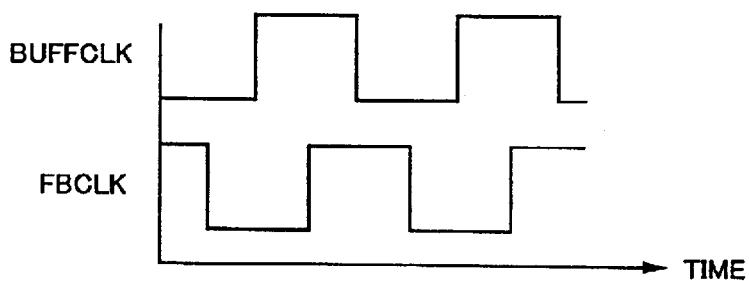
Figure 30:
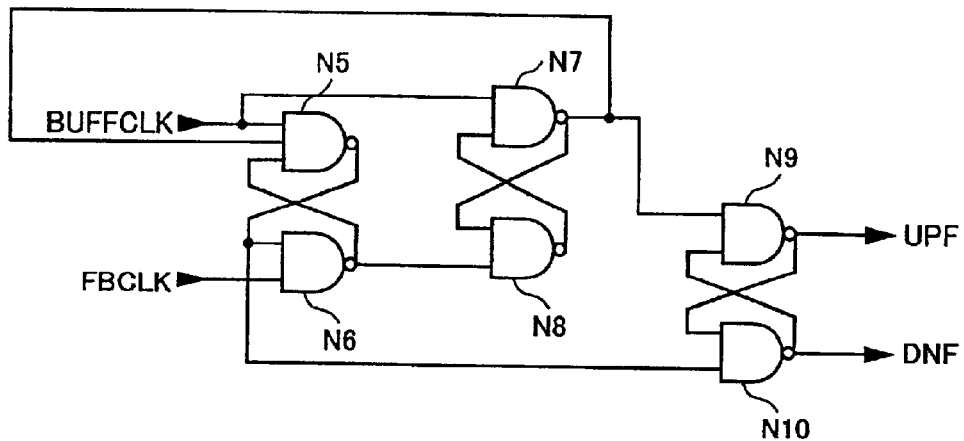
FIG. 30 shows an exemplary configuration of a phase comparator 9.

Reference will now be made to FIG. 16 to describe an exemplary configuration of a semiconductor device 20000 having DLL 2000 of the second embodiment. Semiconductor device 20000, as shown in FIG. 16, includes DLL 2000 receiving external clocks CLKext and ZCLKext, an input buffer 2001 receiving a control signal (a row address strobe signal /RAS, a column address strobe signal/GAS, a chip select signal /CS, a write enable signal /WE and the like), an input buffer 2002 receiving an address signal An, wherein n=0, 1, ... 11, and bank address signals BA0 and BA1, a control signal generation circuit 2003 receiving an output of input buffer 2001 to generate an internal control signal, a row address latch 2004 responsive to the internal control signal for latching a row address output from input buffer 2002, a column address latch 2005 responsive to the internal control signal for latching a column address output from input buffer 2002, a memory array 2006 having a plurality of memory cells arranged in rows and columns, and a plurality of word lines arranged in the direction of the rows and a plurality of bit lines arranged in the direction of the columns, a row decoder 2007 responsive to the internal control signal for selecting a row corresponding to an output of row address latch 2004, and a column decoder 2008 responsive to the internal control signal for selecting a column corresponding to an output of column address latch 2005. Input buffers 2001 and 2002 take a received signal in in synchronization with clock BUFFCLK (or CLKin3) output from DLL 2000. Clock CLKin3 is more suitable for rapid operation than clock BUFFCLK.

Semiconductor device 20000 further includes an array input/output circuit 2009 provided to write/read data to/from memory array 2006, a read-data latch 2010 responsive to the internal control signal for latching read data, an output buffer 2011 taking in data latched by read-data latch 2010, and outputting it to a data input/output terminal DQi, a write-data latch 2012 latching data to be written, and an input buffer 2013 taking data in from data input/output terminal DQi and outputting data to be written to write-data latch 2012.

Output buffer 2011 operates in synchronization with internal clocks CLKin2 and ZCLKin2 output from DLL 2000. Thus, semiconductor device 20000 (a DDR-SDRAM) can output data twice for one clock period.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A delay locked loop comprising:
    a delay circuit for delaying a first clock to output a second clock;
    a detector for detecting which of said first and second clocks is advanced in a phase; and
    a gray code counter using a gray code, responsive to an output of said detector, for selectively generating one of a signal to increase an amount of delay of said delay circuit and a signal to decrease said amount of delay of said delay circuit;
    wherein said output of said detector indicates that said first clock is in advance of said second clock in a phase or said second clock is in advance of said first clock in a phase;
    wherein said gray code counter includes:
        a gray code register for storing said gray code;
        a binary code converter for converting said gray code into a binary code;
        an upward carry/downward carry generator using said binary code stored in said binary code converter, to generate an upward carry signal and a downward carry signal; and
        a carry multiplexer generating from said upward carry signal and said downward carry signal a carry signal corresponding to a result obtained by said detector, for updating said gray code in said gray code register.

2. The delay locked loop according to claim 1, wherein said delay circuit includes a fine delay element and a coarse delay element having an amount of delay greater per unit than said fine delay element, said fine delay element having an amount of delay adjusted by said binary code stored in said binary code converter, said coarse delay element having an amount of delay adjusted by said gray code stored in said gray code register.

3. A semiconductor device comprising a delay locked loop including:
    an input buffer for receiving an external clock and outputting a first internal clock;
    a delay circuit for delaying said first internal clock to output a second internal clock;
    a detector for detecting which of said first and second clocks is advanced in a phase; and
    a gray code counter using a gray code, responsive to an output of said detector, for selectively generating one of a signal to increase an amount of delay of said delay circuit and a signal to decrease said amount of delay of said delay circuit;
    wherein said output of said detector indicates that said first clock is in advance of said second clock in a phase or said second clock is in advance of said first clock in a phase;
    wherein said gray code counter includes:
        a gray code register for storing said gray code;
        a binary code converter for converting said gray code into a binary code;
        an upward carry/downward carry generator using said binary code stored in said binary code converter, to generate an upward carry signal and a downward carry signal; and
        a carry multiplexer generating from said upward carry signal and said downward carry signal a carry signal corresponding to a result obtained by said detector, for updating said gray code in said gray code register.

4. The semiconductor device according to claim 3, wherein said delay circuit includes a fine delay element and a coarse delay element having an amount of delay greater per unit than said fine delay element, said fine delay element having an amount of delay adjusted by said binary code stored in said binary code converter, said coarse delay element having an amount of delay adjusted by said gray code stored in said gray code register.

5. The semiconductor device according to claim 3, further comprising an input circuit operative in response to said second internal clock to externally receive a signal.

6. The semiconductor device according to claim 5, further comprising a memory cell array including a plurality of memory cells, wherein said input circuit receives a signal for writing/reading data to/from said memory cell array.

7. The semiconductor device according to claim 3, further comprising an output circuit operative in response to said second internal clock to externally output a signal.

8. The semiconductor device according to claim 7, further comprising a memory cell array including a plurality of memory cells, wherein said output circuit externally outputs data read from said memory cell array.

9. A semiconductor device comprising a delay locked loop including:
   a first input buffer for receiving at least a first external clock and a second external clock complementary in phase to said first external clock, and outputting a first internal clock at the timing of the rising edge of said first external clock when a potential of said first external clock is equal to that of said second external clock;
   a second input buffer for receiving at least said first and second external clocks, and outputting a second internal clock at the timing of the rising edge of said second external clock when a potential of said first external clock is equal to that of said second external clock;
   a first delay circuit for delaying said first internal clock to output a third internal clock;
   a second delay circuit for delaying said second internal clock to output a fourth internal clock;
   a detector for detecting which of said first and second clocks is advanced in a phase; and
   a gray code counter using a gray code, responsive to an output of said detector for selectively generating one of a signal to increase an amount of delay of said first delay circuit and an amount of delay of said second delay circuit, and a signal to decrease said amount of delay of said first delay circuit and said amount of delay of said second delay circuit;
   wherein said output of said detector indicates that said first clock is in advance of said second clock in a phase or said second clock is in advance of said first clock in a phase.

10. The semiconductor device according to claim 9, further comprising an output circuit operative in response to said third and fourth internal clocks to externally output a signal.

11. The semiconductor device according to claim 10 further comprising a memory cell array including a plurality of memory cells, wherein said output circuit is responsive to said third and fourth internal clocks for externally outputting data read from said memory cell array.

12. A control method for a system operating in synchronization with a clock, comprising the steps of:
   inputting an external clock to an input buffer to generate a first internal clock therefrom;
   delaying said first internal clock to output a second internal clock;
   detecting which of said first and second clocks is advanced in a phase; and
   using a gray code, responsive to a result obtained in the step of detecting, to selectively generate one of a signal to increase an amount of delay to be applied in the step of delaying and a signal to decrease said amount of delay to be applied in the step of delaying;
   wherein said result of detecting indicates that said first clock is in advance of said second clock in a phase or said second clock is in advance of said first clock in a phase;
   wherein the step of using the gray code includes the steps of:
     converting said gray code into a binary code;
     using said binary code to produce an upward carry signal and a downward carry signal; and
     referring to a result obtained in the step of detecting, to generate a carry signal from said upward carry signal and said downward carry signal for updating said gray code.

13. The method according to claim 12, further comprising the step of externally outputting data in response to said second internal clock.

14. The method according to claim 12, further comprising the step of externally receiving data in response to said second internal clock.

* * * * *